(12) United States Patent
Yang

(10) Patent No.: US 10,593,554 B2
(45) Date of Patent: Mar. 17, 2020

(54) METHOD AND APPARATUS FOR WITHIN-WAFER PROFILE LOCALIZED TUNING

(71) Applicant: Jun Yang, Hayward, CA (US)

(72) Inventor: Jun Yang, Hayward, CA (US)

( * ) Notice: Subject to any disclaimer, the term of this patent is extended or adjusted under 35 U.S.C. 154(b) by 0 days.

(21) Appl. No.: 15/941,839

(22) Filed: Mar. 30, 2018

(65) Prior Publication Data

US 2018/0226263 A1 Aug. 9, 2018

Related U.S. Application Data

(63) Continuation-in-part of application No. 14/686,627, filed on Apr. 14, 2015.

(51) Int. Cl.
| | | |
|---|---|---|
| H01L 21/67 | (2006.01) | |
| H01L 21/687 | (2006.01) | |
| G02F 1/13 | (2006.01) | |
| H01L 21/306 | (2006.01) | |
| H01L 21/3105 | (2006.01) | |
| H01L 21/683 | (2006.01) | |
| B24B 37/10 | (2012.01) | |
| B24B 37/005 | (2012.01) | |
| G05B 19/418 | (2006.01) | |
| H01L 21/66 | (2006.01) | |
| H01L 21/02 | (2006.01) | |
| B24B 37/20 | (2012.01) | |

(52) U.S. Cl.
CPC ...... *H01L 21/31053* (2013.01); *B24B 37/005* (2013.01); *B24B 37/107* (2013.01); *B24B 37/20* (2013.01); *G05B 19/4189* (2013.01); *H01L 21/02024* (2013.01); *H01L 21/6838* (2013.01); *H01L 21/68735* (2013.01); *H01L 22/20* (2013.01); *G05B 2219/45031* (2013.01); *G05B 2219/49104* (2013.01); *H01L 22/12* (2013.01)

(58) Field of Classification Search
None
See application file for complete search history.

(56) References Cited

U.S. PATENT DOCUMENTS

| | | |
|---|---|---|
| 5,599,423 A | 2/1997 | Parker et al. |
| 5,941,758 A | 8/1999 | Mack |
| 6,059,638 A | 5/2000 | Crevasse et al. |
| 6,106,369 A | 8/2000 | Konishi et al. |

(Continued)

OTHER PUBLICATIONS

Attaway, Stephen W., "Preston Equation," Downloaded May 23, 2017, www.attawaygems.com/NMFG/preston_equation.html.

(Continued)

*Primary Examiner* — Sylvia MacArthur
(74) *Attorney, Agent, or Firm* — Knobbe, Martens, Olson & Bear, LLP

(57) ABSTRACT

A method and apparatus for within-wafer profile localized tuning is disclosed. In one aspect, the method includes providing a wafer attached to a rotating vacuum stage front side up, the wafer including a surface film with an incoming film thickness profile, providing a pad attached to a rotating head front side down, the head configured to sweep along a path, computing a film thickness removal amount based upon the incoming film thickness profile, and removing at least a portion of the surface film of the wafer based on the computed film thickness removal amount via a plurality of steps.

12 Claims, 20 Drawing Sheets

(56) References Cited

U.S. PATENT DOCUMENTS

| | | | |
|---|---|---|---|
| 6,159,079 | A | 12/2000 | Zuniga et al. |
| 6,361,647 | B1 * | 3/2002 | Halley ................. B24B 37/042 |
| | | | 156/345.1 |
| 6,887,133 | B1 | 5/2005 | Halley |
| 6,913,525 | B2 | 7/2005 | Ishikawa |
| 8,113,918 | B2 | 2/2012 | Koo et al. |
| 8,287,333 | B2 | 10/2012 | Choi et al. |
| 8,382,554 | B2 | 2/2013 | Kim et al. |
| 2001/0019934 | A1 | 9/2001 | Nishimura et al. |
| 2002/0033230 | A1 | 3/2002 | Hayashi et al. |
| 2005/0197045 | A1 | 9/2005 | Novak et al. |
| 2005/0221736 | A1 | 10/2005 | Hsin et al. |
| 2006/0035564 | A1 | 2/2006 | Novak et al. |
| 2008/0153331 | A1 | 6/2008 | Desrosiers et al. |
| 2014/0015107 | A1 * | 1/2014 | Chen .................... B24B 37/015 |
| | | | 257/618 |
| 2014/0162534 | A1 | 6/2014 | Lin et al. |
| 2016/0016282 | A1 * | 1/2016 | Chen ...................... B24B 37/26 |
| | | | 156/345.12 |

OTHER PUBLICATIONS

Perry, Kathleen A., "Chemical Mechanical Polishing: The impact of a New Technology on an Industry," IEEE (1998) Symposium on VLSI Technology Digest of Technical Papers, p. 2-5.

* cited by examiner

METHOD AND APPARATUS FOR WITHIN-WAFER PROFILE LOCALIZED TUNING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This patent application is a continuation-in-part of U.S. application Ser. No. 14/686,627, filed Apr. 14, 2015, which is hereby incorporated by reference in its entirety.

BACKGROUND

Technological Field

The described technology is generally related to the field semiconductor microchip manufacturing, and more particularly, to a method and apparatus for the localized tuning of a within-wafer thickness profile used in advanced nodes of semiconductor process.

Description of the Related Technology

Chemical Mechanical Polishing (CMP) was invented by IBM in 1980s with the purpose of meeting the requirements of shrinking depth of focus in lithography patterning and providing global flat surface to enable multiple stacking metal layer interconnections. One objective of the CMP process is to totally or partially remove the unwanted pre-deposited film, and meanwhile it can be critical to achieve the within-wafer remaining thickness uniformity criteria with minimum yield-reducing defects like scratches, corrosions and particle residues. Kathleen Perry disclosed the CMP technique and its rapid growth in the article "Chemical Mechanical Polishing: The Impact of a New Technology on an Industry" collected by 1998 Symposium on VLSI Technology Digest of Technical Papers. This article, and any other references cited herein are hereby incorporated by reference in their entirety.

SUMMARY OF CERTAIN INVENTIVE ASPECTS

The systems, methods and devices of this disclosure each have several innovative aspects, no single one of which is solely responsible for the desirable attributes disclosed herein.

In one aspect, there is provided a method for thickness profile tuning, comprising: providing a rotating vacuum stage configured to hold a wafer comprising an upwardly facing surface film with an incoming film thickness profile; providing a pad attached to a rotating head, the pad comprising a downwardly facing front side surface, the head configured to sweep along a path, a surface area of the head being less than a surface area of the wafer; removing at least a portion of the surface film of the wafer via a plurality of steps, each of the steps comprising: bringing the surface film of the wafer and the front side surface of the pad into contact with each other, and sweeping the head along the path; and adjusting one or more parameters for each of the removal steps to affect an amount of film thickness removed, wherein the one or more parameters are adjusted based on the incoming film thickness profile and a criteria for the within-wafer-uniformity of the wafer.

The method may further include determining the number of the steps based on the incoming thickness profile and the criteria for the within-wafer-uniformity.

The one or more parameters may comprise one or more of: a size of the head, a head scanning method, a head scanning path, a number of the zones into which the path is divided, starting and ending positions of the zones, a within-zone tuning strategy, polishing parameters, a scanning speed, a wafer rotation speed, a head self-rotation speed, and a slurry flow-rate, and wherein at least one of the parameters is different for two of the steps.

A smaller head may be used for one of the steps with a higher resolution than for another step with a lower resolution.

A larger head may be used for one of the steps with a shorter cycle time than for another step with a higher cycle time.

The head scanning methods may include one or more of: a one-way scanning method in which the head moves in one direction until a final position is reached and an oscillation scanning method in which the head moves back and forth within a predefined region.

The head scanning paths may include one or more of: curved, radial, and diametrical paths.

The method may further comprise determining the number of the zones based on a topography of the incoming thickness profile and a criteria of the tuning resolution.

The method may further comprise determining the starting and ending positions of the zones to be of equal size; or determining the starting and ending positions of the zones based on feature points of a topography of the thickness profiles.

The within-zone tuning strategies may be used to tune an average thickness of each zone to a target thickness.

The method may further comprise determining the polishing parameters based on models including removal curves which characterize the correlation between the amount of film thickness removed at any location on the wafer to the polishing parameters, wherein the polishing parameters include one or more of: the size of the head, a down-force, the scanning speed, the wafer rotation speed, the head self-rotation speed, and the slurry flow-rate.

At least one of the removal steps may comprise oscillation scanning the head along the path, including using a low wafer rotation speed, which is less than 30 RPM, to tune a center of the wafer, within a radially measured distance of 30 mm from the center of the wafer.

At least one of the removal steps may comprise a rough tuning step including oscillation scanning the head along the path to flatten protrusive portions in the incoming film thickness profile.

The method may further comprise placing an edge ring around the wafer during the thickness profile tuning to prevent removal drops at the edge of the wafer.

Placing an edge ring may comprise positioning the edge ring such that a top surface of the edge ring is approximately aligned with the surface film of the wafer.

In another aspect, there is provided a system for thickness profile tuning of a wafer, comprising: a rotating vacuum stage configured to secure a wafer, the wafer comprising an upwardly facing surface film with an incoming film thickness profile; a rotating head; a pad attached to the rotating head, the pad comprising a downwardly facing front side surface, the rotating head configured to sweep the pad along a path, a surface area of the head being less than a surface area of the wafer; a controller; and a computer-readable memory in communication with the controller and having stored thereon computer executable instructions to cause the controller to: remove at least a portion of the surface film of the wafer via a plurality of steps, each of the steps comprising: bringing the surface film of the wafer and the front side down surface of the pad into contact with each other, and sweeping the head along the path, and adjust one or more parameters for each of the removal steps to affect an amount of film thickness removed, wherein the one or more parameters are adjusted based on the incoming thickness profile and a criteria for the within-wafer-uniformity.

The computer-readable memory may further have stored thereon computer executable instructions to cause the controller to determine the number of the steps based on the incoming thickness profile and the criteria for the within-wafer-uniformity.

The one or more parameters may comprise one or more of: a size of the head, a head scanning method, a head scanning path, a number of the zones into which the path is divided, starting and ending positions of the zones, a within-zone tuning strategy, polishing parameters, a scanning speed, a wafer rotation speed, a head self-rotation speed, and a slurry flow-rate, and wherein at least one of the parameters is different for two of the steps.

A smaller head may be used for one of the steps with a higher resolution than for another step with a lower resolution.

A larger head may be used for one of the steps with a shorter cycle time than for another step with a higher cycle time.

The head scanning methods may include one or more of: a one-way scanning method in which the head moves in one direction until a final position is reached and an oscillation scanning method in which the head moves back and forth within a predefined region.

The head scanning paths may include one or more of: curved, radial, and diametrical paths.

The computer-readable memory may further have stored thereon computer executable instructions to cause the controller to determine the number of the zones based on a topography of the incoming thickness profile and a criteria of the tuning resolution.

The computer-readable memory may further have stored thereon computer executable instructions to cause the controller to determine the starting and ending positions of the zones to be of equal size, or determine the starting and ending positions of the zones based on feature points of a topography of the thickness profiles.

The within-zone tuning strategies may be used to tune an average thickness of each zone to a target thickness.

The computer-readable memory may further have stored thereon computer executable instructions to cause the controller to determine the polishing parameters based on models including removal curves which characterize the correlation between the amount of film thickness removed at any location on the wafer to the polishing parameters, wherein the polishing parameters include one or more of: the size of the head, a down-force, the scanning speed, the wafer rotation speed, the head self-rotation speed, and the slurry flow-rate.

At least one of the removal steps may comprise oscillation scanning the head along the path, including using a low wafer rotation speed, which is less than 30 RPM, to tune a center of the wafer, within a radially measured distance of 30 mm from the center of the wafer.

At least one of the removal steps may comprise a rough tuning step including oscillation scanning the head along the path to flatten protrusive portions in the incoming film thickness profile.

The computer-readable memory may further have stored thereon computer executable instructions to cause the controller to place an edge ring around the wafer during the thickness profile tuning to prevent removal drops at the edge of the wafer.

Placing an edge ring may comprise positioning the edge ring such that a top surface of the edge ring is approximately aligned with the surface film of the wafer.

DETAILED DESCRIPTION OF THE CERTAIN INVENTIVE EMBODIMENTS

Figure 1:
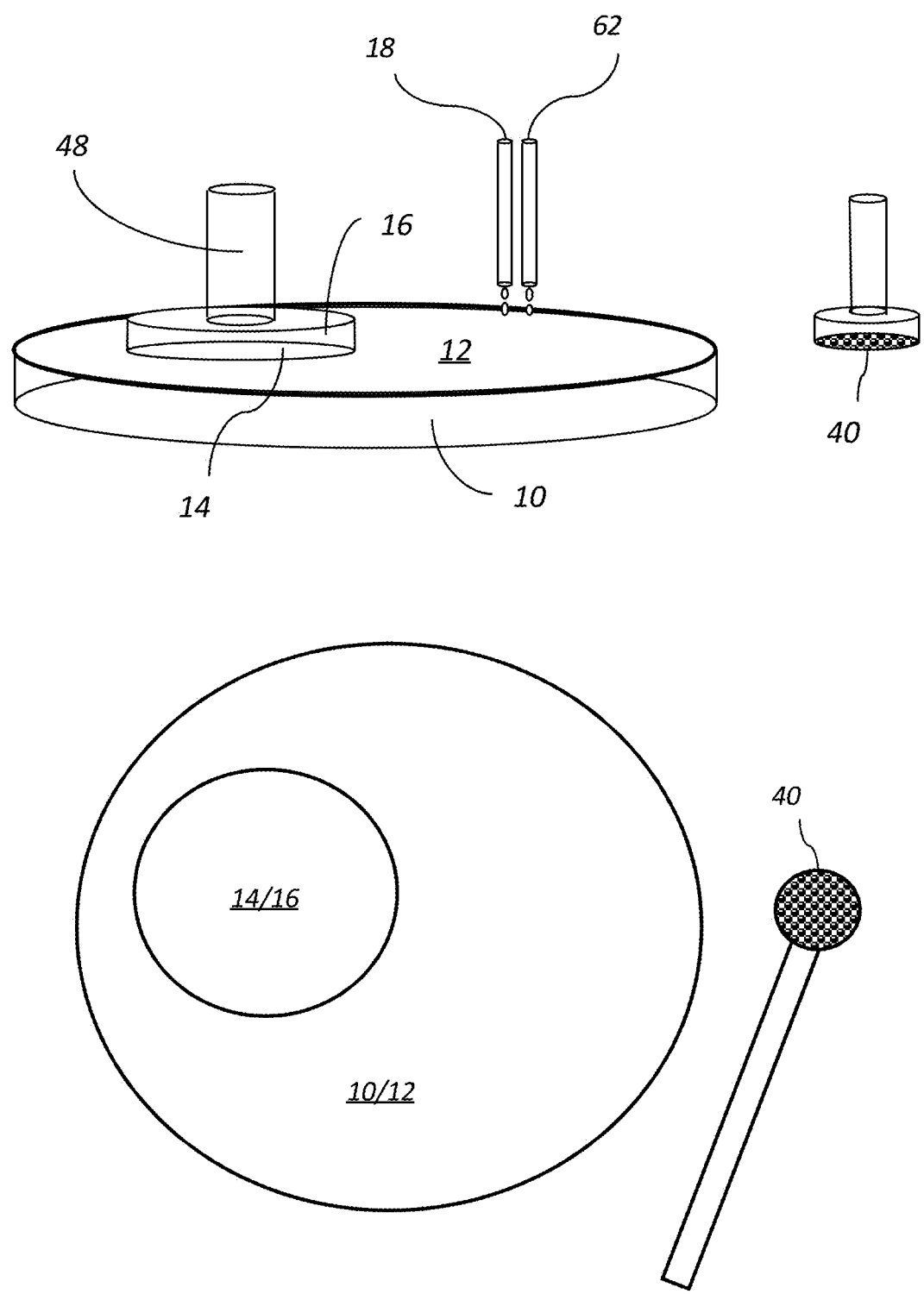
FIG. 1 is a perspective view (upper) and a top view (lower) of a CMP system.

A CMP system as shown in FIG. 1 compromises a platen 10 which is made of hard materials like silicon carbide, and the platen 10 is covered with a replaceable polishing pad 12 made of synthetic plastic. As the carrier of microchips, a wafer 14 is held in a head 16 installed on a spindle 48, and the head 16 pushes the wafer 14 downward to the platen 10 during the polishing and sucks up the wafer 14 by vacuum when the polishing is completed. The platen 10 may be more than twice of the size of the wafer 14, and during the polishing both the platen 10 and the head 16 self-rotate in the same direction. Platen 10 and head 16 rotations contribute the mechanical removal of the material, while abrasives and liquid via a slurry 18 are supplied onto the pad 12 during the polishing to provide the chemical removal. An advanced commercial CMP system normally has multiple platens 10 to achieve high throughput or to remove different types of film than platen 10. Slurry 18 is the agent used to chemically remove the film on the surface of the wafer 14, and it comprises small particles as the abrasives to enhance the mechanical removal mechanism along with other chemical additives and surfactants. In certain circumstances, the minimum amount of the slurry 18 dispensed during the polishing depends on the size of the platen 10, and a large part of the slurry 18 is spun off from the rotating platen 10 even before it is able to reach the surface of the wafer 14. Synthetic plastic material based retainer ring 20 is assembled around the head 16 to prevent the wafer 14 from slipping out during the polishing, and it is grooved to allow the slurry 18 to flow through. Retainer ring 20 needs to be replaced before the grooves are worn out. Synthetic polymer based pad 12 is placed on the top of the platen 10 to be the media touching the wafer 14 during the polishing. Grooves of various patterns are printed to the pad 12 during the fabrication, and those grooves provide the paths for slurry 18 to be transported to the entire surface of the wafer 14. The pad 12 needs to be changed before the grooves are worn out or before the removal rate drops below the acceptable level. The pad 12 tends to generate a lower removal rate after a longer time polishing, and thus a conditioning disk 40 is used to refresh the pad 12 surface after each wafer 14 run to recover the removal rate and keep it stable within the lifetime cycle of the pad 12. Conditioning disk 40 can be made of tiny synthetic diamonds or another hard, abrasive material, and it needs to be changed when the disk starts to lose its capability of sustaining the removal rate.

Ever since the birth of CMP, techniques relating to how to achieve the best possible within-wafer-uniformity have been considered among the most important avenues for improvement, which is at least partially due to the fact that it is more difficult for the slurry to access to the center of the wafer being tightly pressed on the pad. Talieh of Applied Materials proposed a "small pad" system which uses a smaller-than-wafer pad polishing on a wafer facing up in U.S. Pat. No. 5,938,504 filed in 1995. In U.S. Pat. No. 5,599,423, which Parker of Applied Materials filed in 1995, he went on and described a simulator used to acquire optimized CMP parameters (down-force, dwell-time, and pad & head self-rotation speed, etc.) upon the feedback from a previous test run based on Talieh's "small pad" system design. In U.S. Pat. No. 6,106,369 filed in 1998, Konish of Tokyo Electron Limited also described a "small pad" system with integrated cleaning and scrubber function, and also proposed a concept of a two-steps process, named by "rough polishing" and "finish polishing" respectively. Halley of Strasbaugh proposed another "small pad" system described in U.S. Pat. No. 6,361,647 filed in 1999, and he tried to characterize the correlation between the removal and polishing parameters. Halley realized the "erratic" characteristics for center area of the wafer, but he did not give a solid explanation and effective solution for this issue.

In fact, Talieh, Parker, Konish, Halley and others proposed "small pad" systems to replace conventional "big pad" systems. Indeed, localized polishing realized by a "small pad" system offers better within-wafer-uniformity control, however "small pad" systems intrinsically yield much slower removal rate and therefore it is impractical to replace conventional "big pad" systems for CMP process from the cost and efficiency viewpoints. Besides smaller pads require much more frequent change-outs due to the aging of the pad material, hence there are more interrupts of maintenance activities to the manufacturing. For the reasons mentioned above, "small pad" systems never made to the stage of commercial use, and another revolutionary technology was called for the duty.

The concept of multiple-zone-head was proposed by Mack of Intel in U.S. Pat. No. 5,941,758 filed in 1996, and it was integrated into a conventional "big pad" system platform named "Mirra" by Applied Materials as described by Zuniga in U.S. Pat. No. 6,159,079 filed in 1998. "Mirra" systems prevailed easily with the greatly improved within-wafer-uniformity and other equipment suppliers followed the same path later on.

Figure 2:
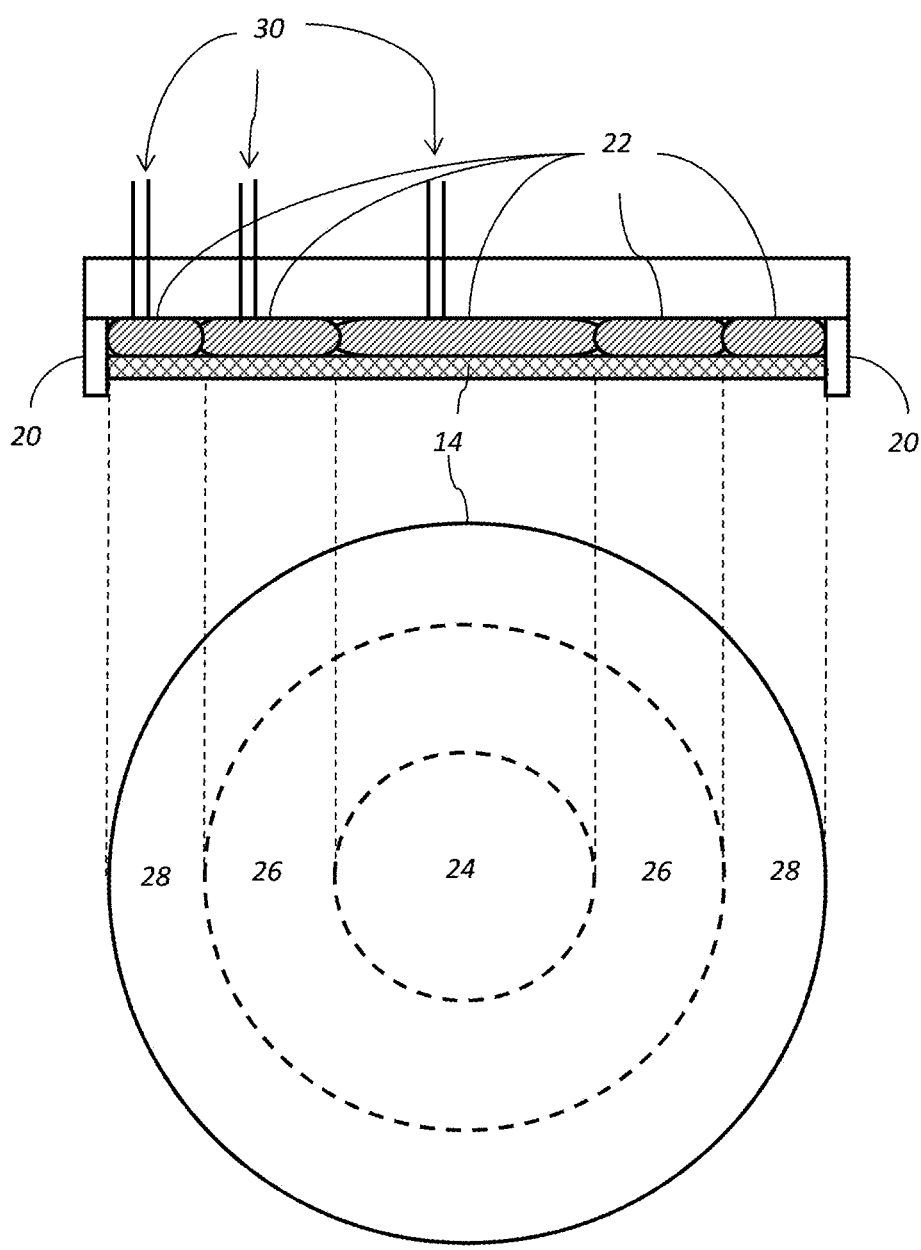
FIG. 2 is a side cross-sectional view of a multiple-zone-head and its zones corresponding to the areas on a wafer.
Figure 3:
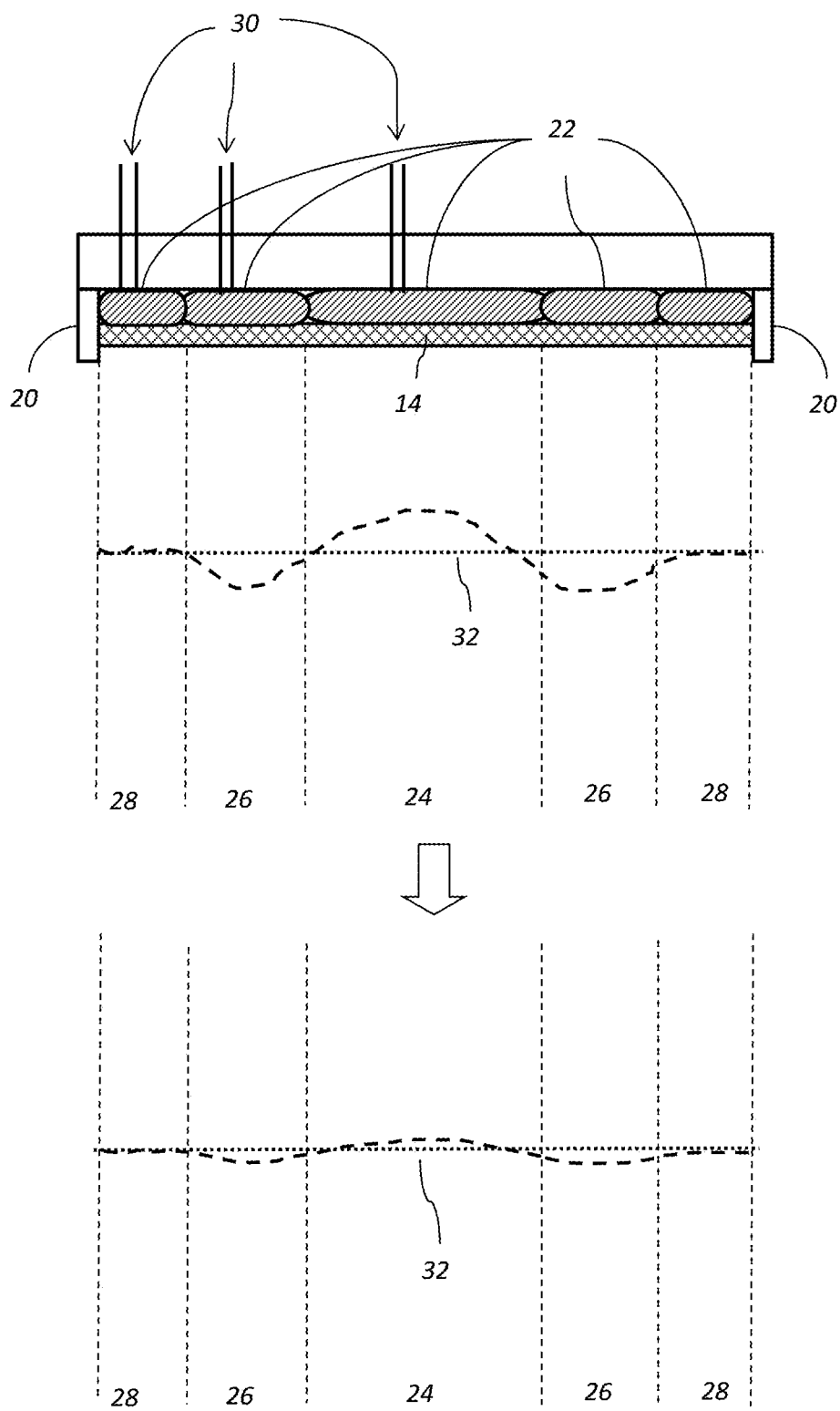
FIG. 3 shows the thickness profiles before (upper) and post (lower) tuning of a multiple-zone-head.

Referring to FIG. 2, a wafer 14 is held in a multiple-zone-head and constrained by a retainer ring 20. The membrane-made and air 30 filled airbags 22 touching the backside of the wafer 14, and the three airbags 22 control three ring-shape zones which are named after the position respectively: center zone 24, middle zone 26 and edge zone 28. The number of the zones of modern multiple-zone-head has reached well above three, however the principle of zonal control stays the same, and herein three zones are used to explain the mechanism out of the sake of simplicity. The principle of multiple-zone-head control is simply that each ring-shape zone controls the removal rate of the part of the wafer 14 accordingly with no overlapping ideally. When the removal rate needs to be higher (because the remaining thickness needs to be thinner), the pressure of the corresponding zone can be increased, and vice versa. As depicted in the upper graph of FIG. 3, it is a remaining thickness profile post a CMP pilot-run. The profile at the center zone 24 is thicker than the target 32, and the middle zone 26 is thinner than the target 32. Therefore in order to optimize the within-wafer-uniformity for later runs, the pressure of the center zone 24 can be increased compared to the setting value used for the pilot-run, while the pressure of the middle zone can be decreased. The lower graph of FIG. 3 shows a thickness profile after such tuning, on later runs. It is important to be note that the profile post CMP process with or without multiple-zone head should be symmetric, since the head is self-rotating during the process. These phenomena can apply for most other semiconductor processes other than CMP, since the chambers are normally symmetric and under many cases, the wafers are rotating during the process. Therefore, in certain embodiments, the thickness profiles discussed and shown in this described technology are all symmetric.

Figure 4:
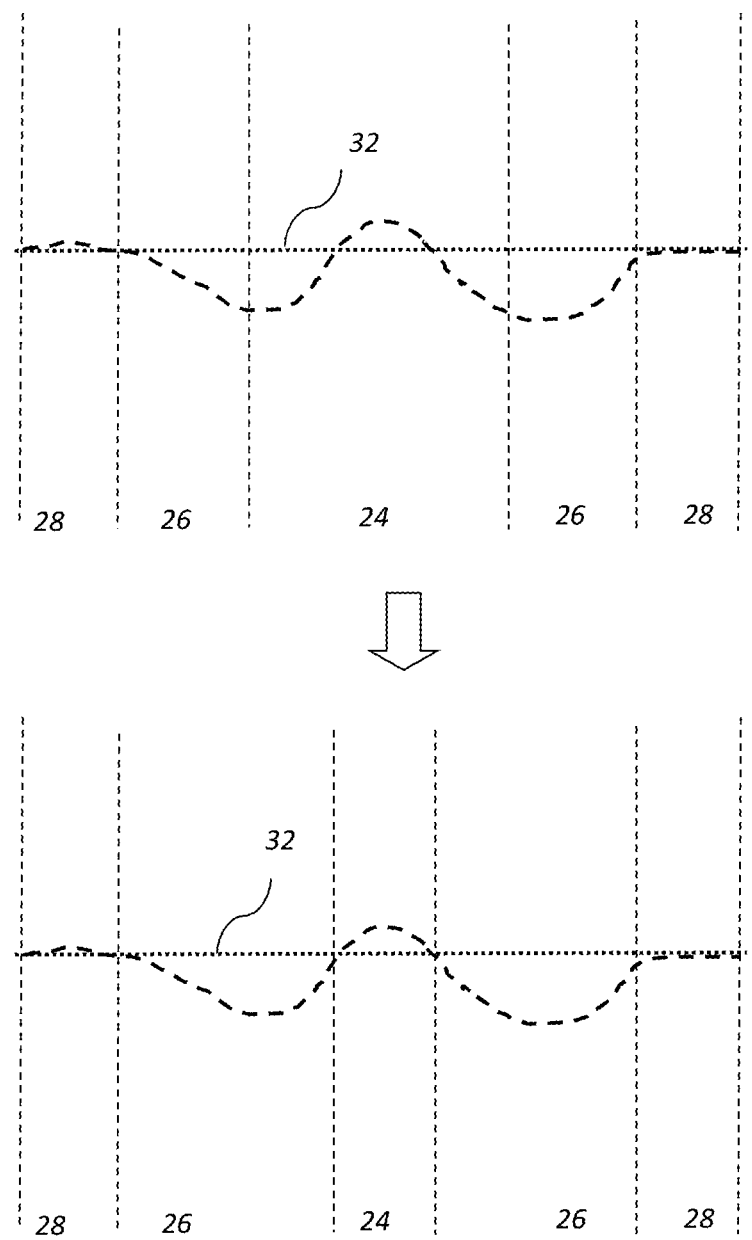
FIG. 4 shows the thickness profiles before (upper) and post (lower) the modification of the size of the zones of a multiple-head-zone head.
Figure 5:
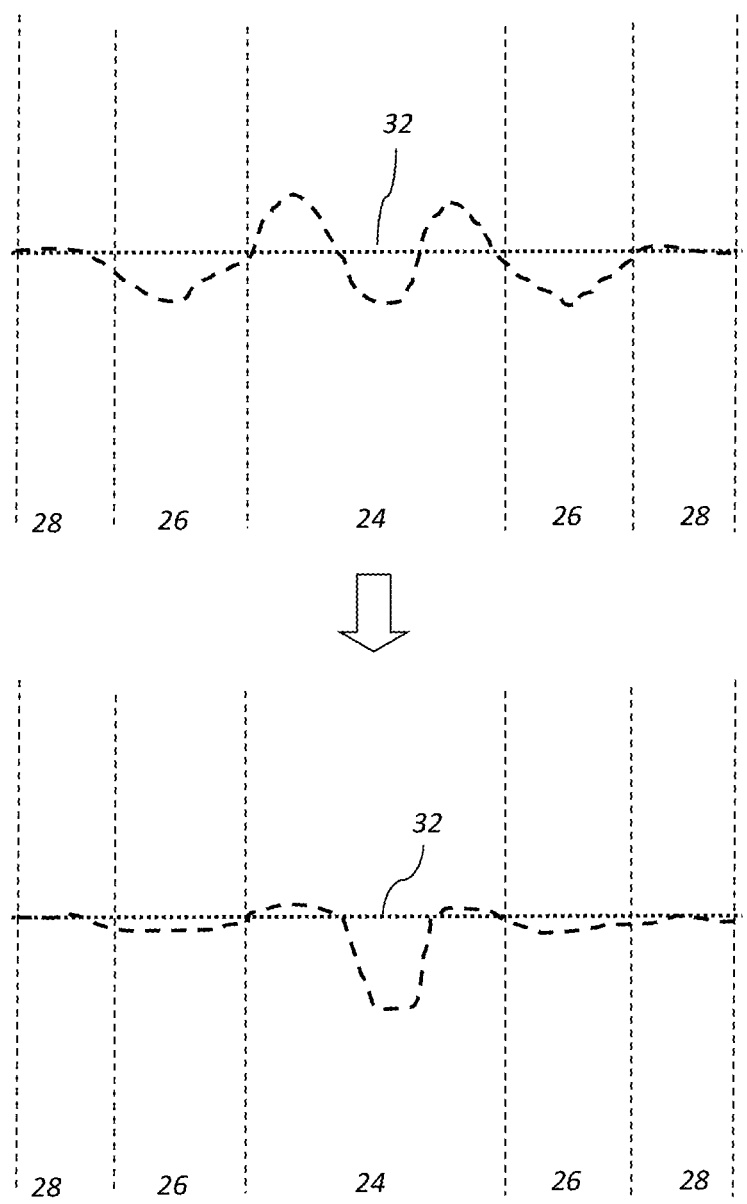
FIG. 5 shows the thickness profiles before (upper) and post (lower) tuning of a multiple-zone-head, and the thickness in the center zone is partially above and partially below the target.

Nevertheless there are limitations of multiple-zone-heads. The thickness profile within an individual zone could be partially above the target 32, and partially below the target 32 as shown in the center zone 24 profile in the upper graph of FIG. 4 and the upper graph of FIG. 5. So it becomes a dilemma of whether one should increase or decrease the pressure for this zone. The lower graph of FIG. 5 shows an example where the pressure is increased in zone 24, in response to the variations shown in zone 24 in the upper graph of FIG. 5. Though part of the thickness profile is closer to the target 32, the center of the profile becomes even lower compared to the profile before the tuning.

Referring back to FIG. 4, in certain implementations, one solution is to modify the size of the zones, e.g., to shrink the center zone 24 and enlarge the middle zone 26 to match the thickness profile as shown in the lower graph of FIG. 4. However, the size of the zones cannot be easily changed since the structure of the membrane and the plate where the membrane is assembled on and attached to the head are normally fixed. Even though these hardware designs can be modified to match this particular type profile, it is impossible to match another incoming different profile without another modification. Those skilled in the art will notice that the thickness profiles post CMP can take many forms, and this is due to the difference in viscosity for various slurries and the different properties in different kind polishing pads.

Figure 6:
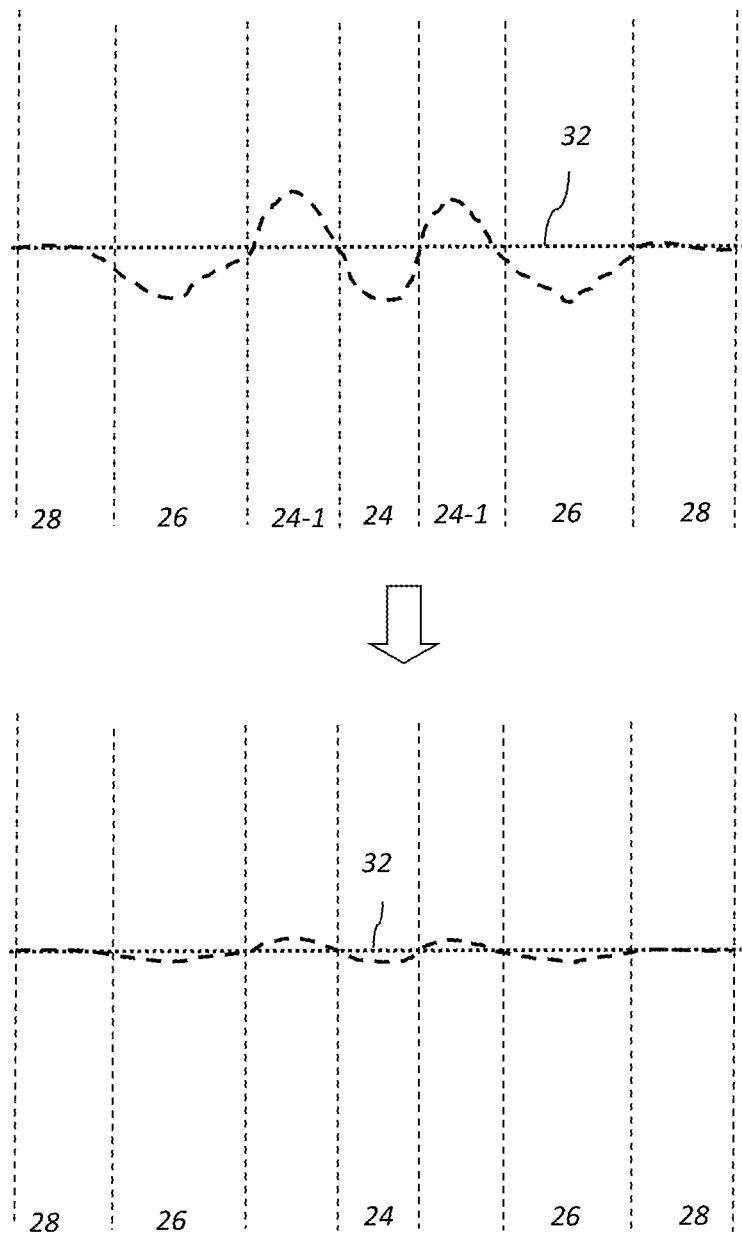
FIG. 6 shows the thickness profiles before (upper) and post (lower) tuning of a multiple-zone-head. The pre-tuning (incoming) thickness profile is identical to the one of FIG. 5, and the original center zone in FIG. 5 is divided into two zones here.

Referring now to the upper graph of FIG. 5, in certain implementations, another solution is to further divide the center zone 24 into two additional separate zones as shown in the upper graph of FIG. 6. The lower graph of FIG. 6 shows the thickness profile post tuning by decreasing the pressure of the center zone 24, and increase the pressure of the newly added zone 24-1. Such increase in the number of the zones becomes a major solution for CMP to meet the continuous tightening criteria for within-wafer-uniformity. Depending on the embodiment, the criteria for within-wafer-uniformity may be defined by an acceptable level of variation in the uniformity of the polished surface. Because of this, the number of the zones of multiple-zone-head has been increased from, for example, two zones at the beginning, to four or five, and then to seven or eight most recently. However, the number of the zones has actually reached its limitation due to the rigidness of the wafer, since the fragile silicon wafer cannot be pressed to comply with both two very small adjacent zones.

In addition to the object of improving the within-wafer-uniformities post CMP, certain aspects of this disclosure relate to optimizing the thickness profiles for most deposition processes. Decades after the use of a multiple-zone-head, there is a desire for another technique to meet the ever-tightening within-wafer-uniformity criteria.

Non-CMP techniques, like ion milling and localized dry etching, are proposed, but both cannot circumvent the damages caused by physical bombardments and provide flexible selectivity between different exposed films as CMP slurries do.

With the advancing of the microchip manufacturing technology nodes, the criteria or the expectation of within-wafer-uniformity of thickness profile(s) has been defined at the lower and the lower value: from one hundred angstroms to tens of angstroms, and most recently even below ten angstroms. Considering only the removal of tens of angstroms instead of hundreds or thousands angstroms like is achievable by standard CMP tools, "low removal," the bottle-neck and the hindrance of "small pad" systems becoming commercially successful, now provides an exclusive advantage since it is capable of much higher resolution in profile tuning, controlling and targeting.

A "small pad" system-based, localized polishing method based on well-characterized comprehensive models is proposed in this disclosure as an effective approach for thickness profile tuning, in order to obtain improved within-wafer-uniformity. The thickness profile tuning can be performed when stringent within-wafer-uniformity criteria needs to be fulfilled, post a multiple-zone-head used CMP process, or a film deposition process as the examples.

Lin of Taiwan Semiconductor Manufacturing proposed a concept of utilizing "small pad" system aiming to improve the within-wafer-uniformity in U.S. Patent Application No. 2014/0162534 filed in 2014 as well, but no clear model was mentioned for the decision of the polishing parameters, and he more focus on "improperly polished" profiles tuning caused by "defective, damaged" CMP multiple-zone heads. As used herein, a "small pad" system refers to a polishing pad with a total surface area that is smaller than the total surface area of a wafer being polished. The polishing pad may face downwardly, to polish an upwardly-facing wafer surface. For example, the small pad system can have a polishing pad with a diameter that is smaller than the diameter of a wafer being polished by the polishing pad. For example, the polishing pad can have a surface area or diameter that is approximately 95%, 90%, 80%, 85%, 80%, 75%, 70%, 65%, 60%, 55%, 50%, 45%, 40%, 35%, 30%, 25%, 20%, 15%, 10%, or 5% of the corresponding surface area or diameter of the wafer being polished.

Figure 7:
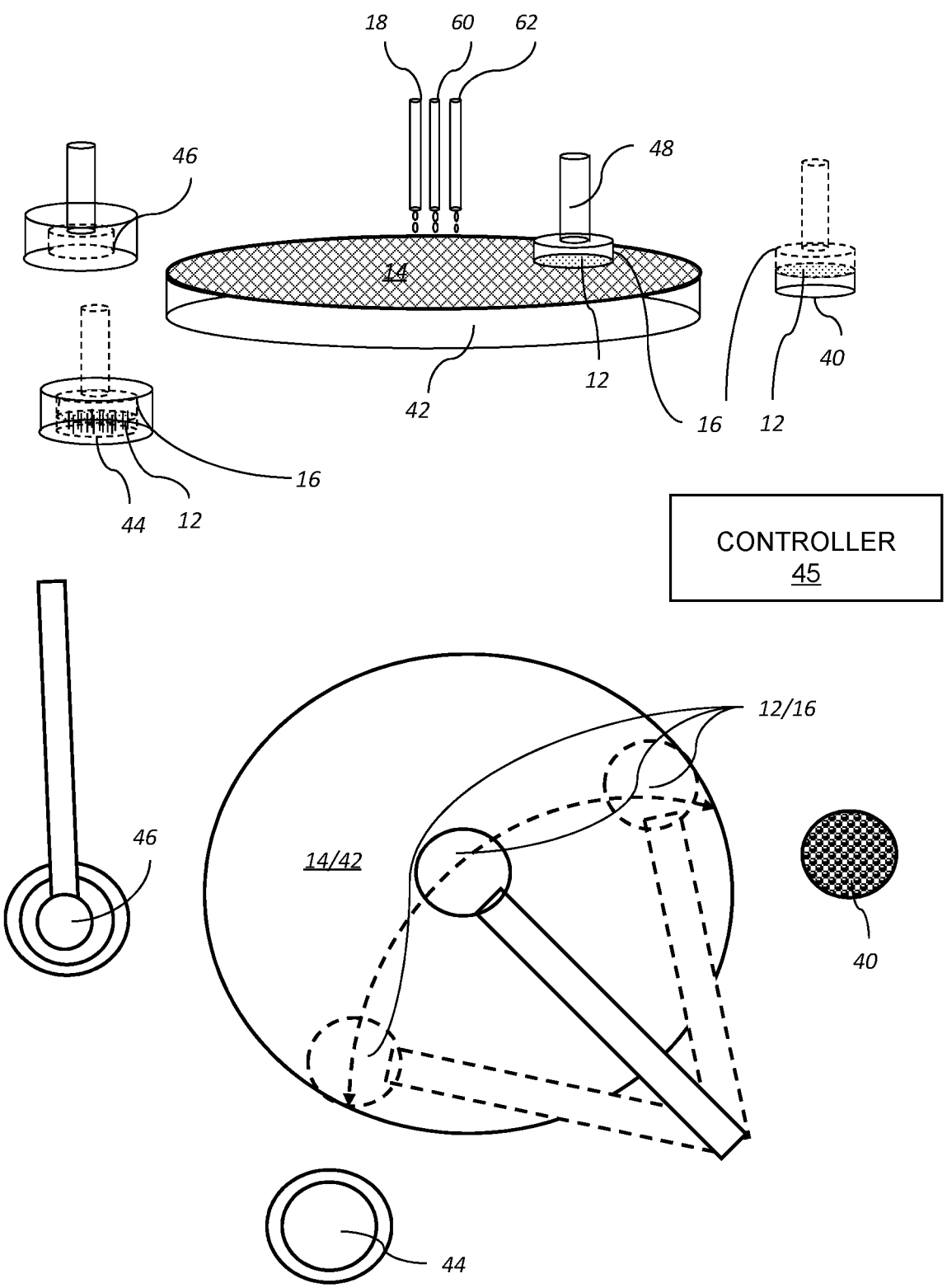
FIG. 7 is a perspective view (upper) and a top view (lower) of a "small pad" system which is proposed to perform localized tuning of the thickness profile. The scanning path shown here is curved.

Referring to the upper portion of FIG. 7, a "small pad" system is shown, which can be configured to allow a wafer 14 to be placed on a vacuum stage 42 facing up, and polished by a significantly smaller head 16 comprising a pad 12. A "vacuum stage" can explicitly use vacuum, or can use other means to hold the wafer 14. During the polishing both the stage 42/wafer 14 and the head 16/pad 12 are rotating, while the head 16 is sweeping across or scans through the surface of the wafer 14 following a specific path (a curved scanning path is shown in the lower graph in FIG. 7). The slurry 18 is applied onto the surface of the wafer during the polishing, and later chemical 60 and deionized (DI) water 62 are supplied to clean the wafer 14 with the assistance of a sponge 46. The pad 12 is cleaned by a brush 44 and then conditioned by a diamond disk 40. Although not illustrated, the wafer thickness profile tuning system may also include a controller 45 (e.g., a processor, microcontroller, etc.) configured to control the thickness profile tuning process. For example, the controller 45 may be configured to control the scanning of the pad 12, via the head 16, along the wafer 14 to control an amount of film thickness removed during the process. The controller 45 may further be configured to adjust one or more parameters to affect the amount of film thickness removed. Details regarding the various parameters which may be adjusted and how these parameters can affect the amount of film thickness removed is provided below. One or more of, and thus any combination of these parameters can be implemented in the methods and apparatuses described herein, to affect the amount of film thickness removed (or not removed), and thus the film thickness profile and overall within wafer uniformity.

Figure 9:
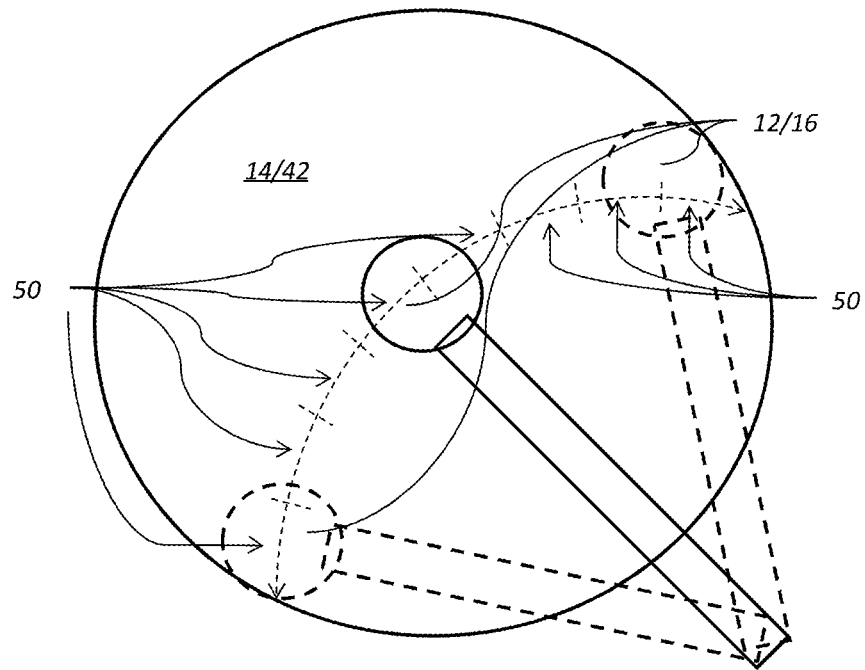
FIG. 9 shows a curved scanning path divided into zones for a "small pad" system.

The scanning path is divided into sections called "zones 50" as shown in FIG. 9. The number of the zones 50, the starting and ending positions of each zone, the rotation speed of the stage 42 and the head 16 itself, the down-force and the scanning speed (or dwell time) of the head 16 are decided upon the incoming thickness profiles and based on well-characterized comprehensive models which will be described in this disclosure. As mentioned above, the incoming steps could be any finished process requiring further within-wafer-uniformity improvement including CMP and deposition processes.

A "small pad" CMP system has been built and tested, hence a method of profile tuning along with comprehensive models are developed and will be herein introduced.

Part I. Theories and Concepts

1. Correlation Between the Parameters and the Removal Amount

Referring to Preston's Equation, it will be understood by those skilled in the art that faster scanning speed accompanied by shorter dwell time, and less down-force generates less amount of removal, while slower sweeping speed or more down-force creates more amount of removal. The correlations between the removal amount vs. parameters are listed as below, with an upward pointing arrow indicate an increase in the parameter or response in removal amount listed, and a downward arrow indicting a decrease in the parameter or response in removal amount listed; it will be understood that the converse of each arrow will be true, unless otherwise indicated. Thus, for example, a decrease in total process time will result in a decrease in removal amount, and so forth:

| Parameters | Response in Removal Amount |
| --- | --- |
| Total Time↑ | ↑ |
| Head Down-Force↑ | ↑ |
| Scanning Speed↑ Dwell Time↓ | ↓ |
| Wafer/Stage Rotation Speed↑ | ↑, however too fast rotation will cause slurry spun-off instantly after it touches the surface of the wafer, which could cause insufficient chemical reactions, therefore reduce the removal rate. |
| Polish Head Rotation Speed↑ | Almost no impact in removal amount, but could improve within-head-uniformity. |
| Slurry Flow-Rate↑ | ↑→ will first increase then saturate above certain value. |

2. Definition of Scanning Paths or Scanning Methods

Figure 8:
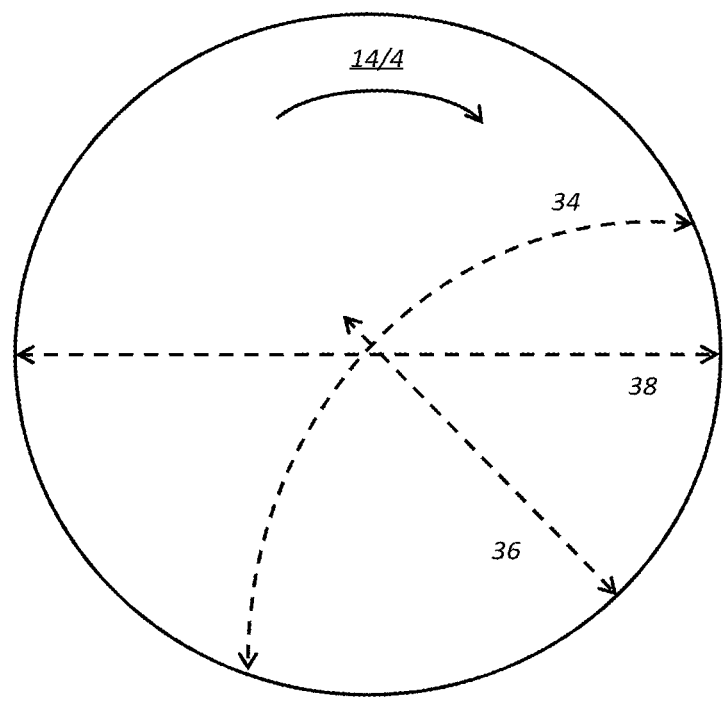
FIG. 8 is a top view of the different scanning paths of a "small pad" system.
Figure 10:
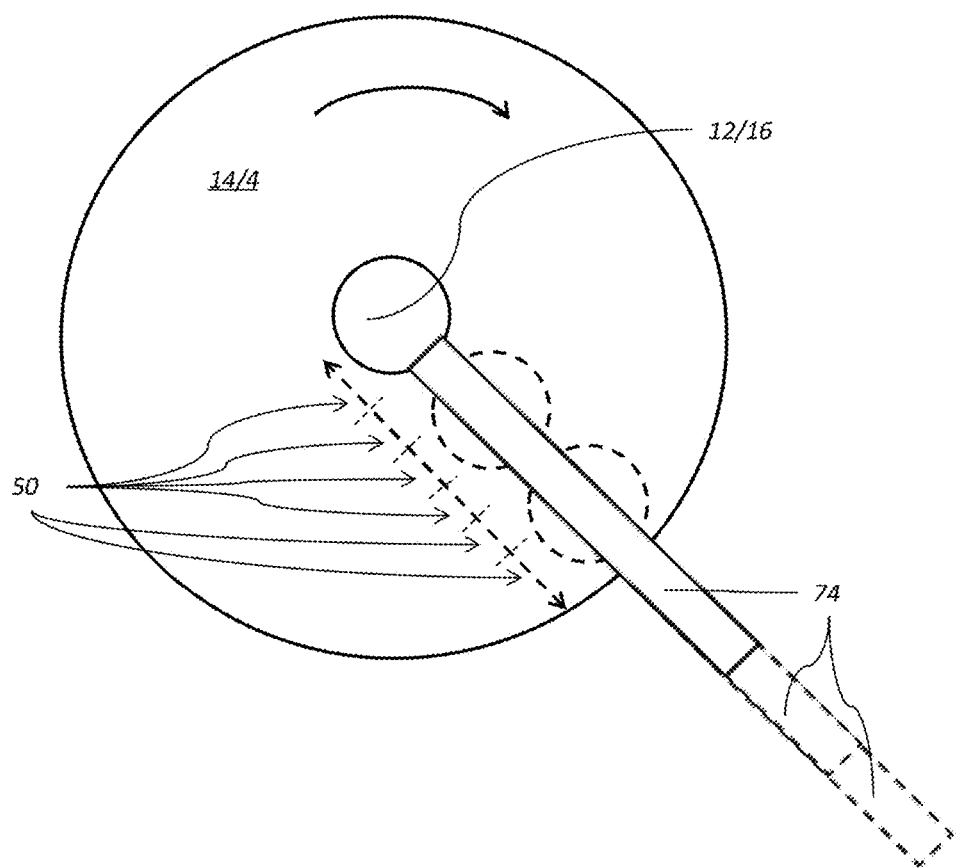
FIG. 10 shows a radial scanning path divided into zones for a "small pad" system.

In a "small pad" system, a head installed with a polishing pad sweeps across the surface of the wafer with applied down-force. The sweep routes of the head are referred as "scanning paths" in this disclosure, and the paths are further defined into different types. "One-Way Scanning" refers to the head moving in one direction without turning back until it finishes the scan, and one-way scanning can be repeated multiple times if needed. In other words, during a one-way scan, the head will not change the scanning directions until the current pass is completed. Referring to FIG. 8, various one-way scanning paths are defined as curved path 34, radial path 36 and diametrical path 38. FIG. 9 and FIG. 10 show a curved path and a radial path divided into zones 50 respectively. "Oscillation Scanning" refers to the head moving back and forth within a region, and the number of the cycles or the total oscillation time can be defined. As used herein, the selection of a one-way scanning vs. oscillation scanning for a step of the tuning process may be considered a selection of a head scanning method.

Part II. Characterization and Models

1. Characterization of One-Way Scanning for the Region Other Than Center Area

In one example embodiment, a one-way scanning technique using a constant scanning speed of 0.5 mm/sec, and a constant down-force at 5 psi and 7 psi for two separate runs has been performed as one of many characterizations. In this embodiment, the size of the head is 20 mm, and the pad scans from the center of the wafer to 130 mm from the center (where the side of the 20 mm pad matches the edge of the wafer) on a 300 mm wafer following a radial path. The film deposited on the wafer is plasma-enhanced chemical vapor deposited (PECVD) silicon dioxide, and the fused silica based slurry is flowed at 50 ml/min. The wafer and the stage are spun at 100RPM and the head is self-rotating at 30 RPM. The removal amount is acquired by calculate the thickness difference measured along the diameter of the wafer before and post the scanning.

Figure 11:
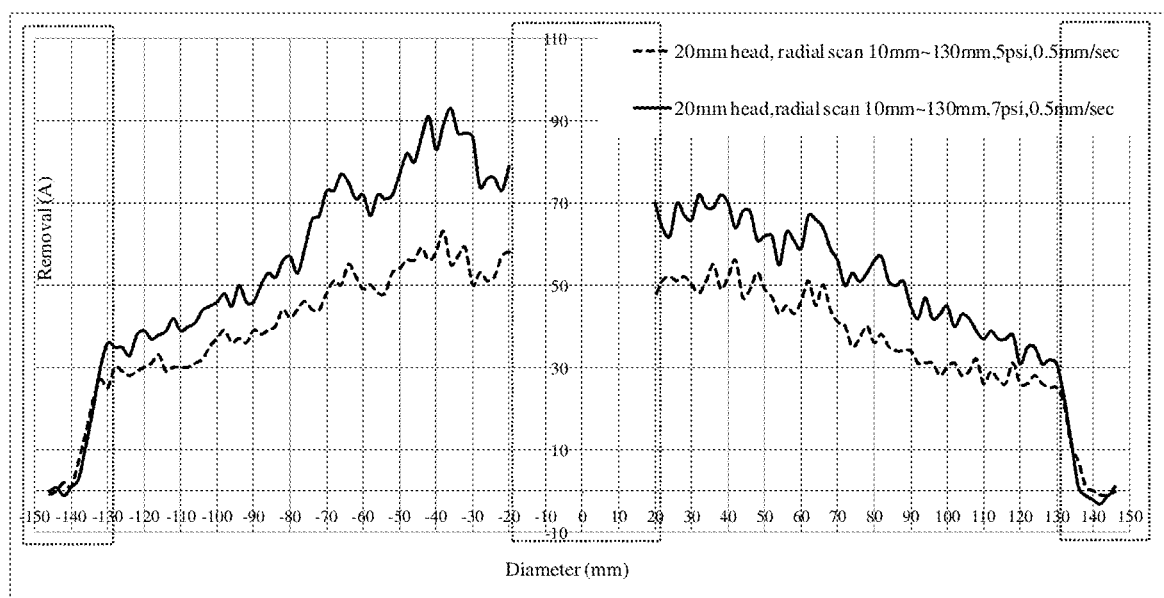
FIG. 11 is an example of a graph of the removal rate of a one-way diametrical scanning path for a "small pad" system, and it is used as a reference to decide the polishing parameters (down-force, scanning speed/dwell time, etc.).

The characterization of this embodiment is depicted in FIG. 11, and the removal amount decreases roughly linearly when the head scanning outwards from the center of the wafer. This can be explained as that the ring shape area needs to be covered by the head (installed with the pad) in the same time period (since the scanning speed is constant) is proportional to the distance between where the head resides to the center of the wafer. Thus the farther the head resides from the center of the wafer, the bigger the ring shape area needs to be covered, and the removal amount on average in this bigger ring shape area is lower accordingly.

Since the removal amount acquired around the center of the wafer (e.g., radial±10 mm) becomes even higher and unstable with a sudden deep drop at the center of the wafer, this part of the data is not shown in FIG. 11. Halley also mentioned this "erratic" performance in U.S. Pat. No. 6,361,647 filed in 1999, but Halley did not give a solid explanation or an effective solution. This phenomenon can be explained as that most of the center area (radial±10 mm in this example) is covered by the head (20 mm in this example) when it scans through this center area. This is different from other zones of the wafer, where only a small portion of the ring-shaped area is covered by the head at a time. Therefore, the frictions become much greater and generate lots of shocks to the head spindle even with the cushion or air cylinder design, and impair the precision of pressure control. In certain embodiments, the higher the wafer rotation speed is, the more difficult it is to maintain accurate pressure control. Besides, since the linear speed at the center of the wafer is zero, the removal amount drops dramatically and it becomes even more difficult to tune the profile at the center area. An effective control of the profile at the center area will be discussed in later sections.

Figure 12:
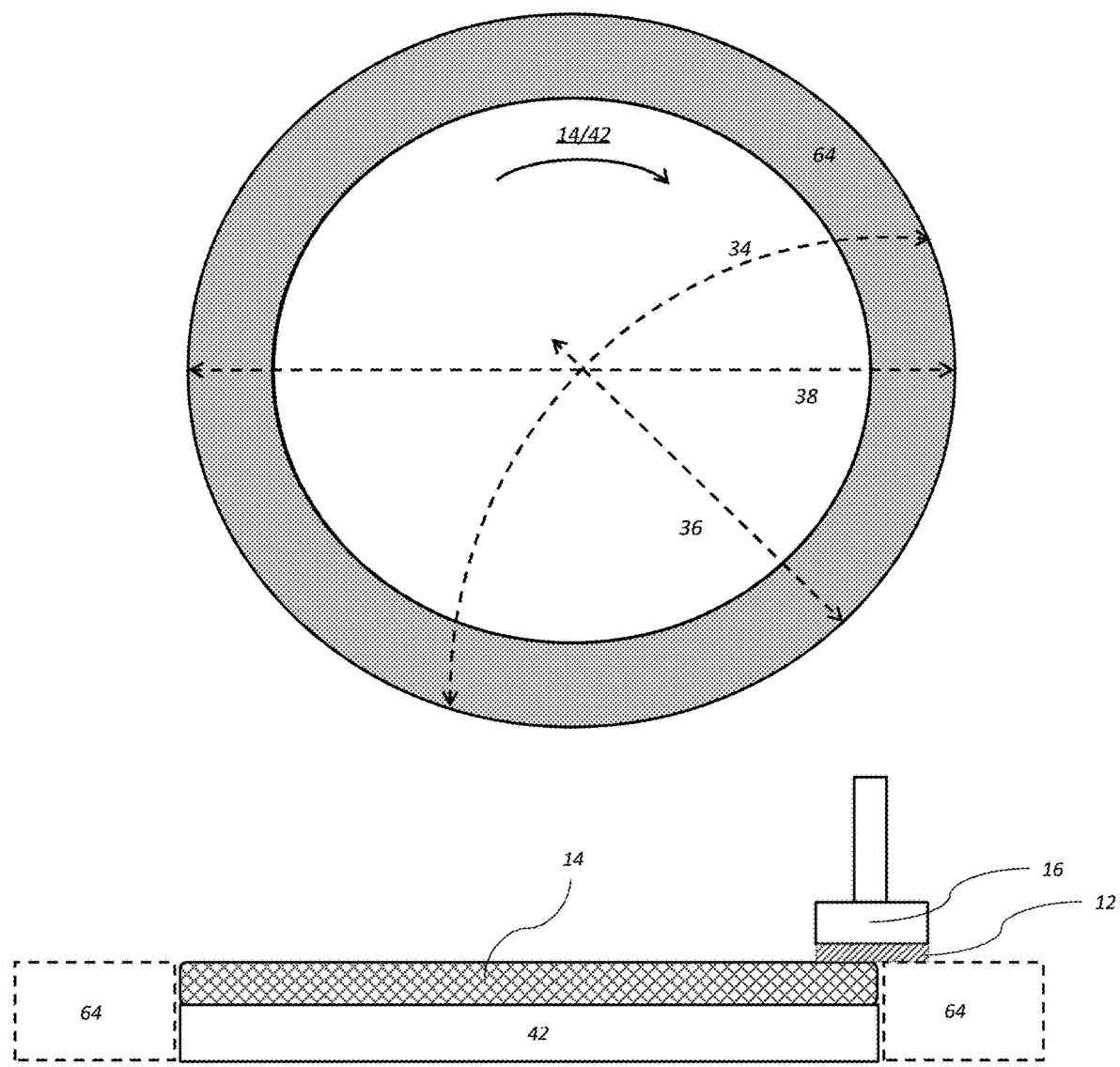
FIG. 12 is a top view (upper) and side view (lower) of a "small pad" system with an added edge ring, and it is designed to solve the removal rate drop at the edge of the wafer.

The drop of the removal amount is also observed at the edge of the wafer (radius>130 mm). It can be explained as that, the slurry is quickly spun off at the edge of the wafer before it can be even effectively involved in chemical reactions, thus causes the lower removal there. Also when the center of the head move close to the edge of the wafer, a portion of the head actually already leaves the surface of the wafer, and the down-force cannot be effectively applied onto the surface for the wafer through the entire head. The system may effectively control the edge of the wafer up till the radius beyond 147 mm since there are still many intact dies in this area for 300 mm wafers. To solve this issue, an edge ring 64 is proposed as shown in FIG. 12. This can be designed to have an alcove in the stage 42 which hold the wafer 14 seamlessly. In certain embodiments, the width of the edge ring 64 is larger than the size of the head 16 (20 mm in this example). In certain embodiments, the top surface of the edge ring 64 may be aligned (i.e., at approximately the same vertical elevation) with the surface of the wafer 14 to avoid any shock when the head 16 moves across the boundary between the wafer 14 and the edge ring 64. Since this may essentially extend the area of the wafer, the removal amount will be raised for the area between radius 130~150 mm.

The removal curves like the one shown in FIG. 11 may be used for thickness profile tuning. The curves basically work as look-up tables, and it allows the engineers to search for the removal amount of one one-way scanning at a specific location with predefined parameters. For example, for the same parameters used as for FIG. 11, for down-force of 5 psi, the removal of −70 mm is about 50 angstroms. Many other removal curves of different parameter combinations have been acquired and summarized, and they can be used for much more extensive thickness profile tuning.

2. Characterization of Oscillation Scanning for Center Area

Figure 13:
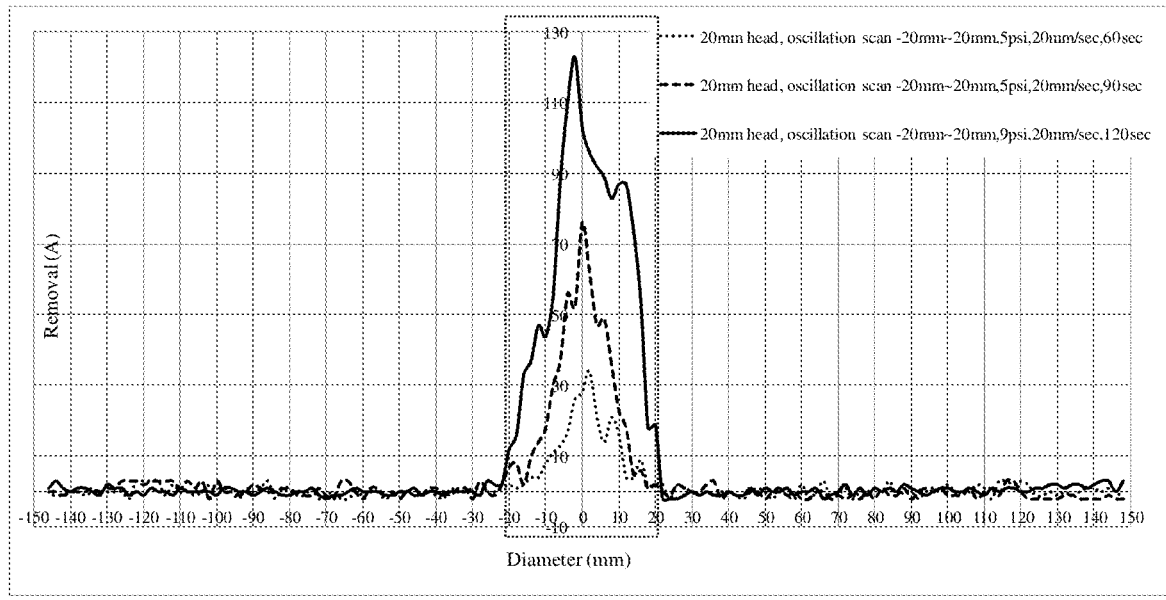
FIG. 13 is an example of a graph of the removal rate of an oscillation scanning path for a "small pad" system, and it is used as a reference to decide the polishing parameters (down-force, scanning speed/dwell time, etc.).

For certain applications, the removal profiles provided by one-way scanning can be too high (not suitable for high resolution tuning), unstable (the consistent shocks to the head assembly due to friction), and can result in removal dip (very low removal for the center point) for the center area of the wafer. Accordingly, in certain embodiments, oscillation scanning is used to achieve precise, stable and predictable control. As an example, a group of removal curves are shown in FIG. 13, which illustrates an embodiment based on a 20 mm head oscillating between −20 mm to 20 mm in radius, scanning speed is 20 mm/sec, the wafer is rotated at 20 RPM while the head is spun at 100 RPM, and the down-forces are various. Here, the wafer rotation speed may be intentionally set low (20 PRM compared to 100 RPM for a typical one-way scanning implementation) to minimize the shocks to the head assembly, hence the scanning speed is significantly increased (20 mm/sec comparing to 0.5 mm/sec for one-way scanning) to raise the removal rate which has dropped due to low wafer rotation speed.

As explained above, similar to FIG. 11, the embodiment of FIG. 13 can be used to look up the exact removal amount at specific location(s) for the center area of the wafer. For example, for the same parameters used as for FIG. 13, for down-force at 5 psi and oscillating for 90 seconds, the removal at 10 mm is about 20 angstroms. Many other removal curves of different parameter combinations have been acquired and summarized, and they can be used for much more extensive thickness profile tuning.

Figure 14:
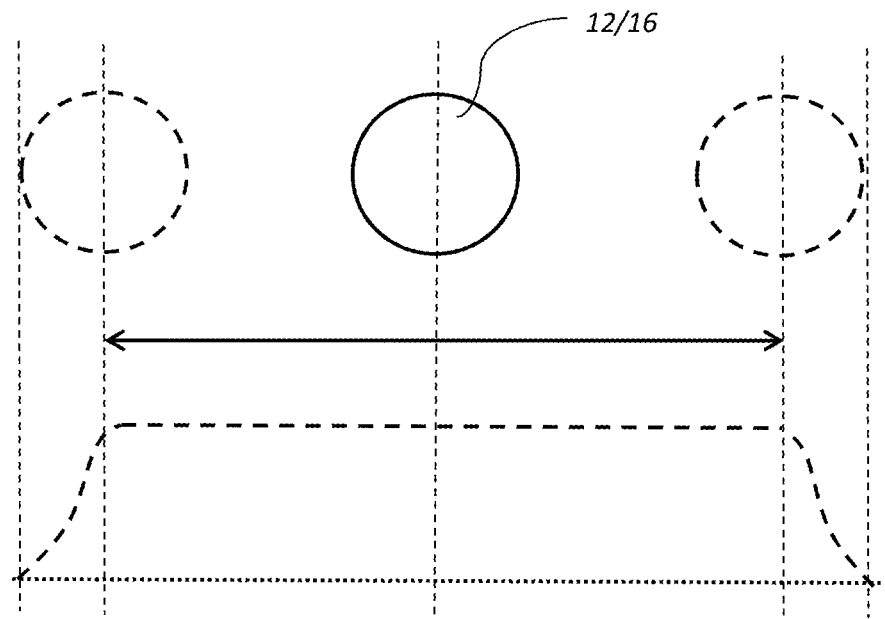
FIG. 14 shows the removal profiles of an oscillation scanning path, with the size of the pad is ¼ of the oscillation span.
Figure 15:
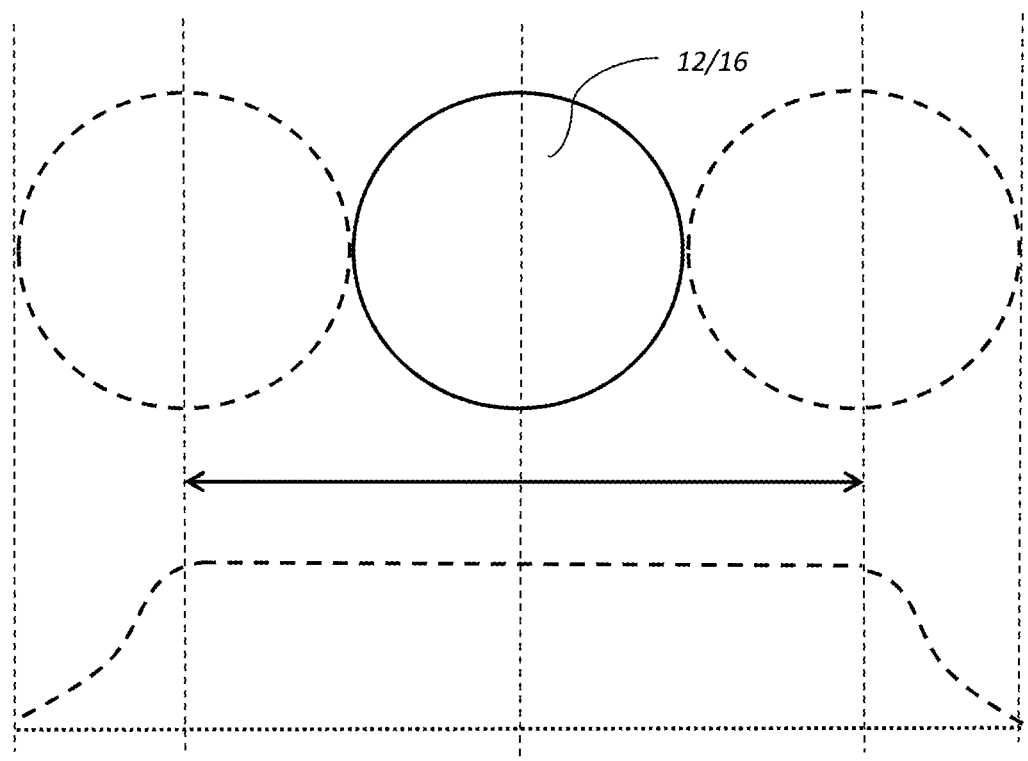
FIG. 15 shows the removal profiles of an oscillation scanning path, with the size of the pad is ½ of the oscillation span.
Figure 16:
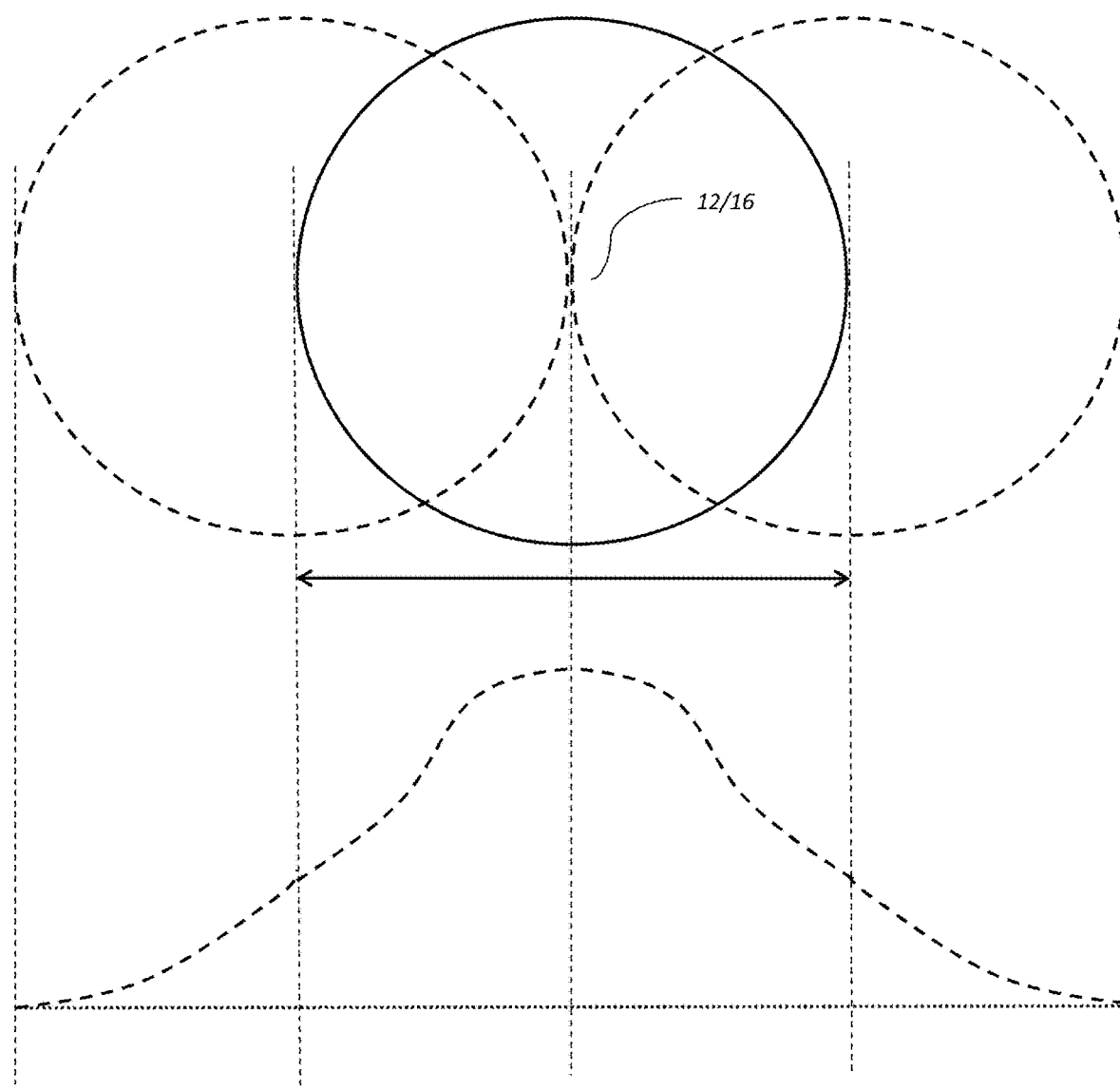
FIG. 16 shows the removal profiles of an oscillation scanning path, with the size of the pad substantially equal to the oscillation span.

One aspect of this disclosure relates to the removal curves generated by oscillation scanning being protrusive. In certain embodiments, the shape of the removal curve is strongly related to the size of the head. Referring to FIG. 14, the size of the head 12 is about ¼ of the oscillation region (the vertical dashed lines spanning the arrows shown), wherein the center of the head 12 is used to identify the overall position of the head 12. Thus, when the center of the head 12 resides at the boundary of the oscillation region, half of the head 12 is outside of the region (shown by the outermost vertical dashed lines), and it will also generate removal outside of the region at an amount which is tapering towards the far end. For this case, the shape of the removal curve (shown in dashed lines towards the bottom of FIG. 14) is similar to a trapezoid. Similarly, in an embodiment illustrated in FIG. 15 the size of the head 12 is about ½ of the oscillation region, and the shape of the removal curve is similar to a trapezoid, but the area with tapering removal outside the region is increased compared to the FIG. 14 embodiment since its size equals to the radius of the head 12. However when the head 12 is the same size as or even bigger than the oscillation region, as shown in the embodiment of FIG. 16, the removal curve shifts to being protrusive (i.e., no longer flat within the oscillation region and protruding upwardly as shown). This is because the center of the oscillation region is almost always covered by some portion of the head 12, and the removal at the center becomes significantly higher than other parts of the oscillation region.

3. Strategies of Zone Division and Within-Zone Parameters Choice

According to aspects of this disclosure, there are various strategies of dividing the zones and decide which parameters to change for the incoming profile tuning, and each strategy varies in efficiency (resolution, how good the within-wafer-uniformity can be achieved, vs. throughput, how long take to finish the tuning). In practice, the engineers can choose one or combine any strategies upon the criteria of within-wafer-uniformity and throughput.

i. Equal Zone Size and Constant Parameters Within-Zone

Figure 17:
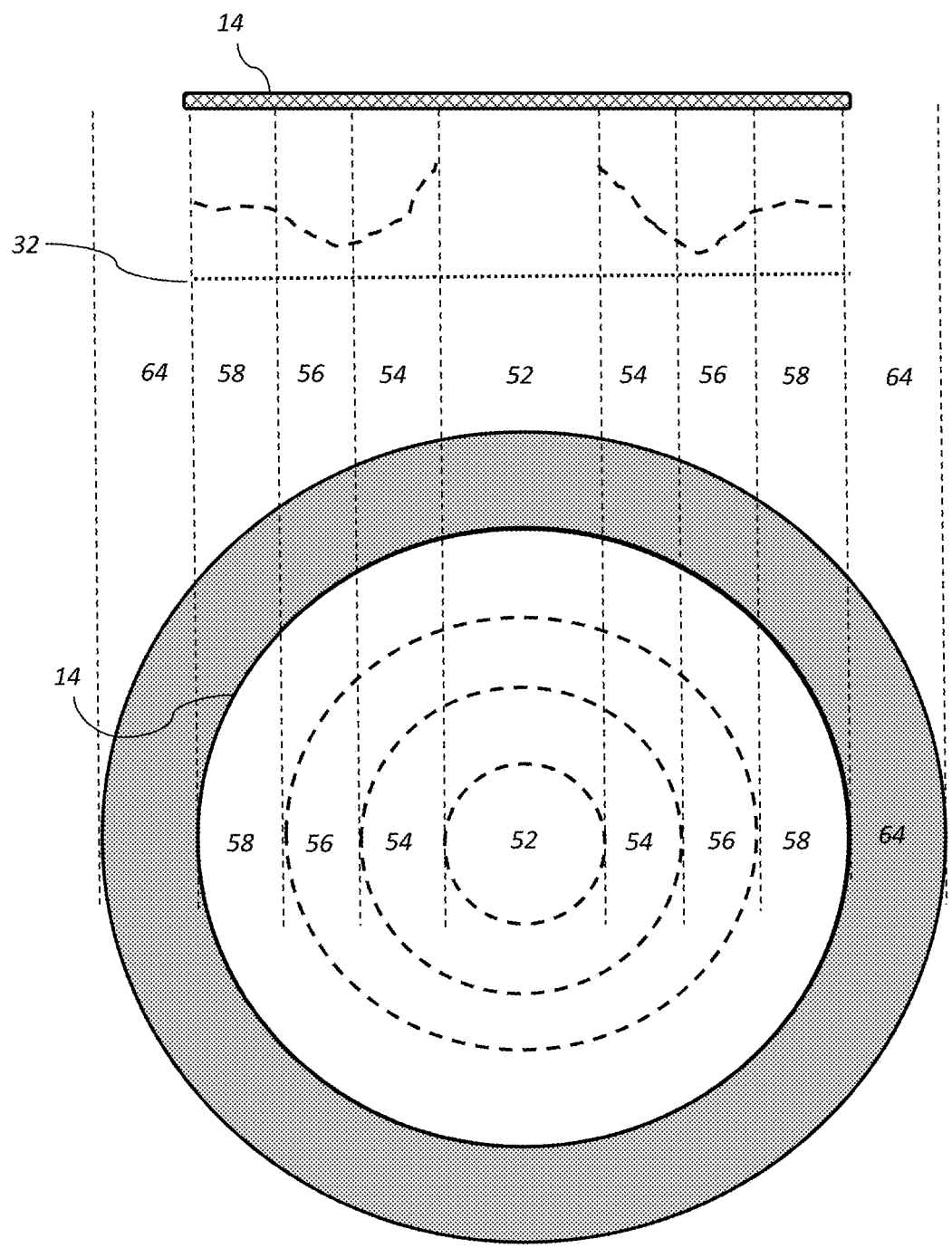
FIG. 17 is a side view of the zones and the corresponding areas on a wafer for a "small pad" system.

In one embodiment, the scanning path can be divided into zones of equal sizes, and the same parameters can be used as long as the head is in the same zone. Referring to FIG. 17 and the upper graph in FIG. 18, there are four zones: Z0 52, Z1 54, Z2 56, and Z3 58. For Z0 52, which is located in the center of the wafer, the polishing parameters are selected by looking up the appropriate removal profile of an oscillation scanning in FIG. 13. For other zones, the thickness average of each zone before the tuning is calculated, and the removal amount of each zone is computed by subtracting the value of the target 32 from the thickness average. The polishing parameters for each zone are selected by looking up the removal curves of one-way scanning in FIG. 11 to match the computed removal amount. Those parameters may be set to stay the same within each zone. As an example, the polishing parameters of each zone for tuning the incoming thickness profile in the upper graph of FIG. 18 according to one embodiment are shown below.

| Parameters | Z0 | Z1 | Z2 | Z3 |
|---|---|---|---|---|
| Starting Position (mm from the center) | 0 | 30 | 70 | 110 |
| Ending Position (mm from the center) | 30 | 70 | 110 | 150 |
| Size of the Pad (mm) | 20 | 20 | 20 | 20 |
| Scanning Path | oscillation | radial | radial | radial |
| Head Down-Force (psi) | 5.0 | 7.0 | 5.5 | 6.0 |
| Head Scanning Speed (mm/sec) | 20 | 1 | 1 | 1 |
| Dwell Time (sec) (calculated for Z1~Z3) | 60 | 40 | 40 | 40 |
| Wafer Rotation Speed (RPM) | 20 | 100 | 100 | 100 |
| Head Self-Rotation Speed (RPM) | 100 | 30 | 30 | 30 |
| Slurry Flow-Rate (ml/min) | 50 | 50 | 50 | 50 |

Figure 18:
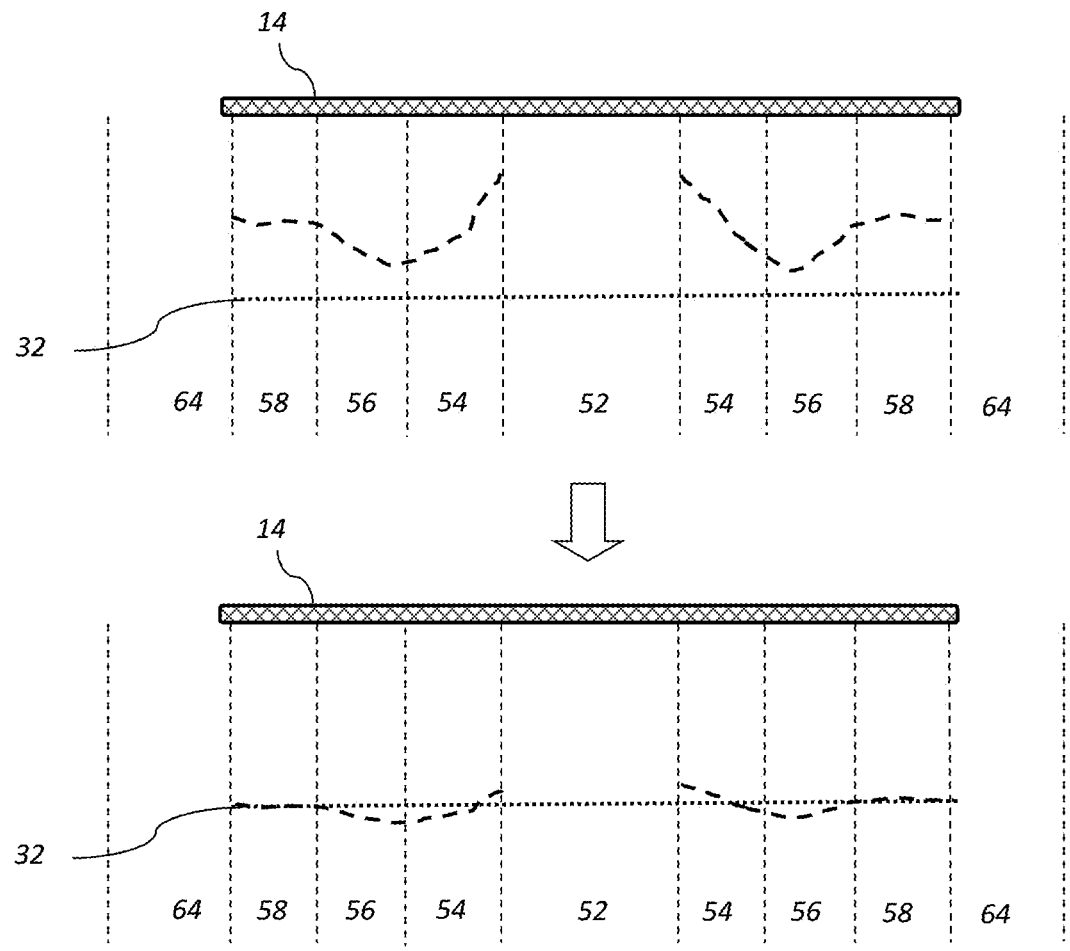
FIG. 18 shows the thickness profiles before (upper) and post (lower) one of the tuning methods by a "small pad" system.

The lower graph in FIG. 18 shows the thickness profile post tuning. In certain embodiments, the more zones that the wafer is divided into, the better within-wafer-uniformity post tuning will be. However since the size of the head is in this embodiment is 20 mm, any zone having a size less than 20 mm is substantially meaningless. Therefore the number of zones cannot be increased indefinitely. The impact of head size selection will be discussed in a later section. Also a strategy of selecting "Different Zone Size and Constant Parameters Within-Zone" can also be setup by following the example shown above.

ii. Different Zone Size and Varying Parameters Within-Zone

The division of the zones can be selected based on the incoming thickness profile. Referring to the upper graph in FIG. 19, there are four zones: Z0 52, Z1 54, Z2 56, and Z3 58. Similarly, Z0 52 is located in the center of the wafer, and the polishing parameters are selected by looking up the appropriate removal profile for oscillation scanning as in FIG. 13. The remaining zones are divided to make sure that in each zone the trending of the profile is unidirectional, i.e., either up-trend (zone 54) or down-trend (zone 56). For the zones of up-trend, the removal amount needs to be increased as the head moves from the beginning of the zone to the end of the zone, while for the zones of down-trend, the removal amount needs to be reduced as the head moves from the beginning of the zone to the end of the zone. However it may not be recommended to change the polishing parameters in real-time for each very small section in the zone, which requires changes in pressure that are too frequent, or scanning speed, or wafer/head rotation speed since the hardware simply may not be able to respond quickly enough within such a short time. In practice, by removing an amount based on the target 32, only the removal amounts at the beginning position and ending position of the zone are calculated, and then the polishing parameters for these two locations are selected by looking up the removal curves of one-way scanning as in FIG. 11 to match the computed removal amount.

Figure 19:
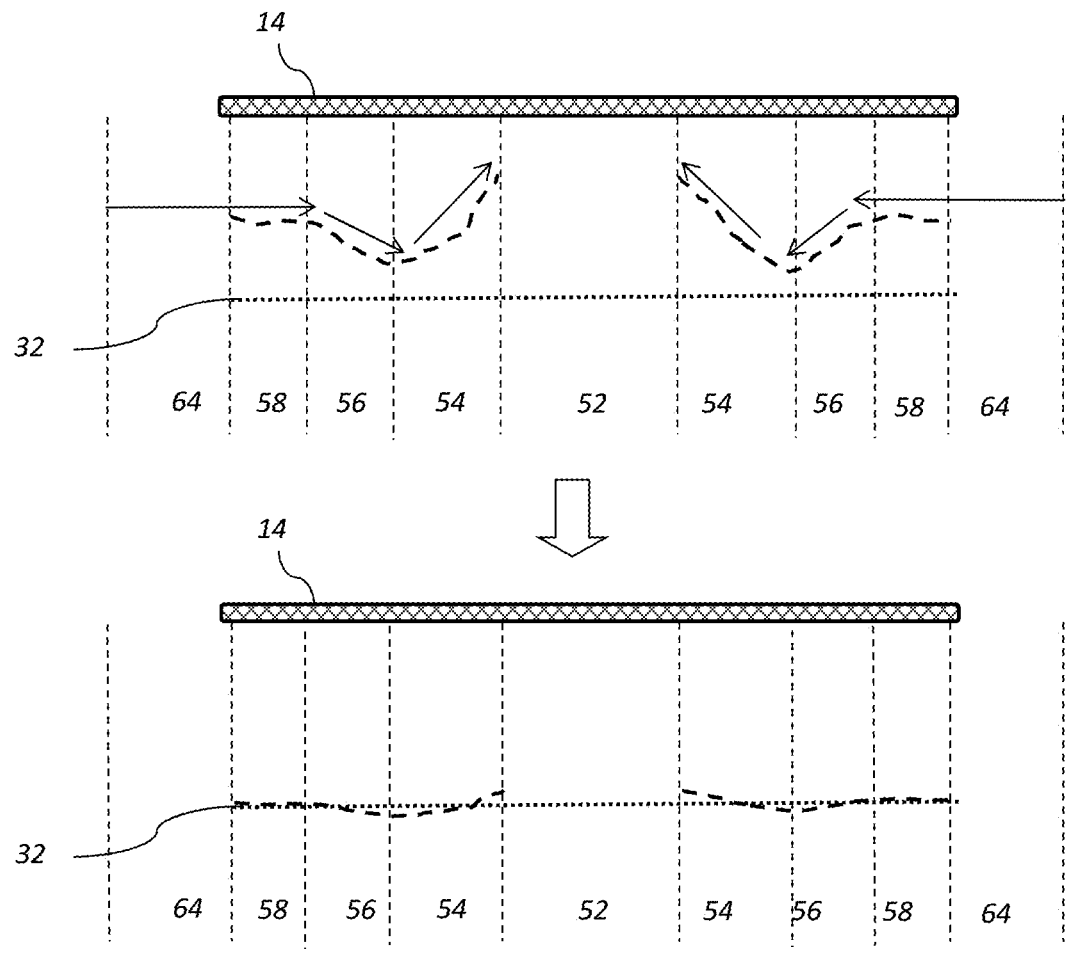
FIG. 19 shows the thickness profiles before (upper) and post (lower) another tuning method by a "small pad" system.

As the first example, within each zone, the scanning speed may be kept constant while the down-force is changed linearly. The parameters of each zone for tuning the incoming thickness profile in the upper graph of FIG. 19 are shown below.

| Parameters | Z0 | Z1 | Z2 | Z3 |
|---|---|---|---|---|
| Starting Position (mm from the center) | 0 | 30 | 70 | 110 |
| Ending Position (mm from the center) | 30 | 70 | 110 | 150 |
| Size of the Pad (mm) | 20 | 20 | 20 | 20 |
| Scanning Path | oscillation | radial | radial | radial |
| Head Down-Force at the starting position (psi) | 5.0 | 7.0 | 6.0 | 5.5 |
| Head Down-Force at the ending position (psi) | 5.0 | 6.0 | 5.5 | 6.5 |
| Head Scanning Speed at the starting position (mm/sec) | 20 | 1 | 1 | 1 |
| Head Scanning Speed at the ending position (mm/sec) | 20 | 1 | 1 | 1 |
| Dwell Time (sec) (calculated for Z1~Z3) | 60 | 40 | 40 | 40 |
| Wafer Rotation Speed (RPM) | 20 | 100 | 100 | 100 |
| Head Self-Rotation Speed (RPM) | 100 | 30 | 30 | 30 |
| Slurry Flow-Rate (ml/min) | 50 | 50 | 50 | 50 |

As a second example, within each zone, the down-force is kept constant while the scanning speed is changed linearly. The parameters of each zone for tuning the incoming thickness profile in the upper graph of FIG. 19 are shown below.

| Parameters | Z0 | Z1 | Z2 | Z3 |
|---|---|---|---|---|
| Starting Position (mm from the center) | 0 | 30 | 70 | 110 |
| Ending Position (mm from the center) | 30 | 70 | 110 | 150 |
| Size of the Pad (mm) | 20 | 20 | 20 | 20 |
| Scanning Path | oscillation | radial | radial | radial |
| Head Down-Force at the starting position (psi) | 5.0 | 7.0 | 5.5 | 6.0 |
| Head Down-Force at the ending position (psi) | 5.0 | 7.0 | 5.5 | 6.0 |
| Head Scanning Speed at the starting position (mm/sec) | 20 | 1 | 1.2 | 1.4 |
| Head Scanning Speed at the ending position (mm/sec) | 20 | 1.2 | 1.4 | 1.3 |
| Dwell Time (sec) (calculated for Z1~Z3) | 60 | 40 | 40 | 40 |
| Wafer Rotation Speed (RPM) | 20 | 100 | 100 | 100 |
| Head Self-Rotation Speed (RPM) | 100 | 30 | 30 | 30 |
| Slurry Flow-Rate (ml/min) | 50 | 50 | 50 | 50 |

The lower graph in FIG. 19 shows the thickness profile post tuning. Varying the parameters constantly within individual zones requires quick response and high reliability of hardware. Furthermore, this strategy demands a relatively large database including the removal amount(s) corresponding to each of the different parameters at each location of the wafer.

4. Head Size and Profile Tuning Resolution

Figure 20:
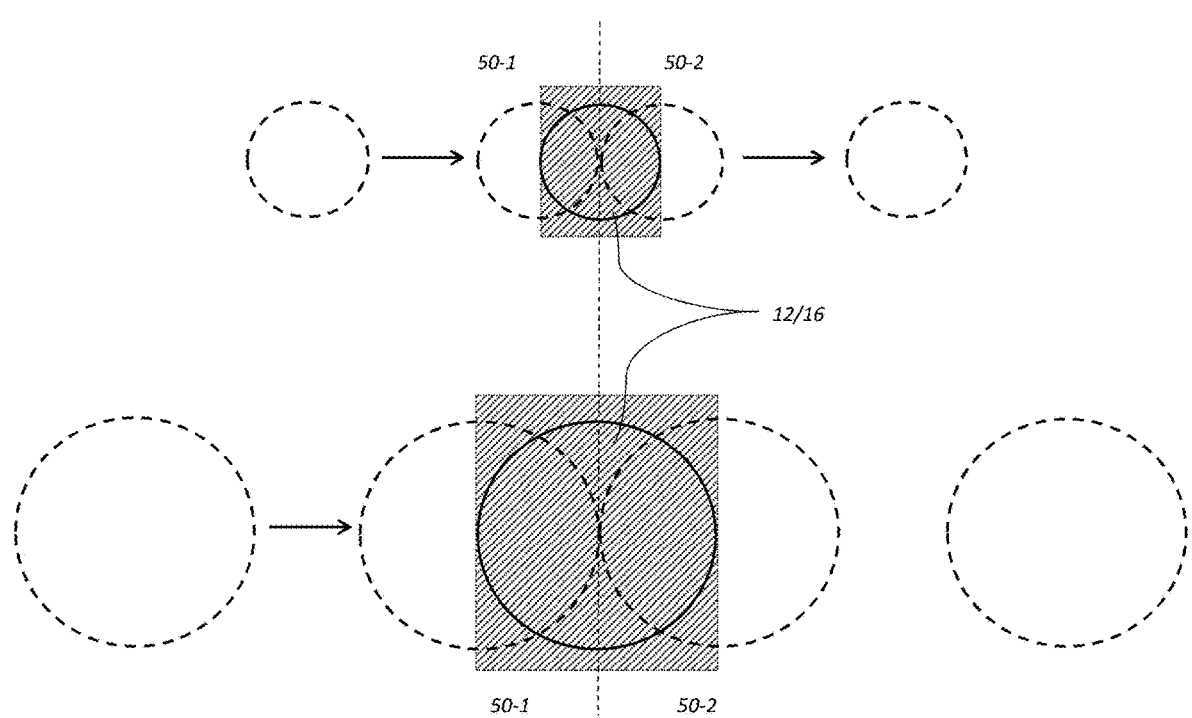
FIG. 20 shows that for a "small pad" system, pads of different sizes have different size of overlap area, thus different resolution in thickness profile tuning.

The correlation between the size of the head and the resolution or the within-wafer-uniformity that can be achieved by tuning is discussed in this section. As depicted in FIG. 20, a smaller head 16 (the upper graph) and a bigger head 16 (the lower graph) move across the boundary of two adjacent zones 50-1/50-2 (illustrated by the dashed vertical line). The areas in shadow start when the right side of the heads 16 enter the zone 50-2 on the right, and end when the left side of the heads 16 leave the zone 50-1 on the left. When the heads 16 reside in the shadow or overlapping area, they cover both zones 50-1/50-2, and they can only apply the same down-force at the same time. Normally the center of the head 16 represents the overall position of the head 16. When the center of the head 16 has not crossed the boundary, the down-force applied follows the setting of the zone 50-1 on the left, however the same down-force is also applied by the portion of the head 16 which is already in the zone 50-2 on the right. A similar situation occurs after the center of the head 16 has crossed the boundary to the other side. In certain embodiments, the smaller the overlapping area is, the higher the resolution of the tuning will be. The size of the overlapping area may be equal to the size of the head 16, therefore a smaller head provides better resolution and better within-wafer-uniformity achievable. However, the cycle time of tuning becomes significantly longer for a smaller head, and therefore the throughput becomes lower for a much smaller head 16.

5. Multiple Steps

In this disclosure, the selected parameters are assumed to be optimized based on the aforementioned well-characterized comprehensive models. In other words, improved within-wafer-uniformity can be achieved by using the model-based parameters described herein. Therefore, the topics of how to refine the parameters based on the result from the previous run, like Parker described in U.S. Pat. No. 5,599,423, and Halley proposed in U.S. Pat. No. 6,361,647, are considered non-related to this disclosure. Somehow, in case the within-wafer-uniformity does not meet the expectation, a second step needs to be added to further improve the uniformity. In this case, the previous tuning is considered as "rough tuning", while the second step is considered as "fine tuning." Since the polishing parameters are assumed been already fully optimized during the rough tuning, as aforementioned, a smaller head capable of higher resolution can be used for the fine tuning step.

Figure 21:
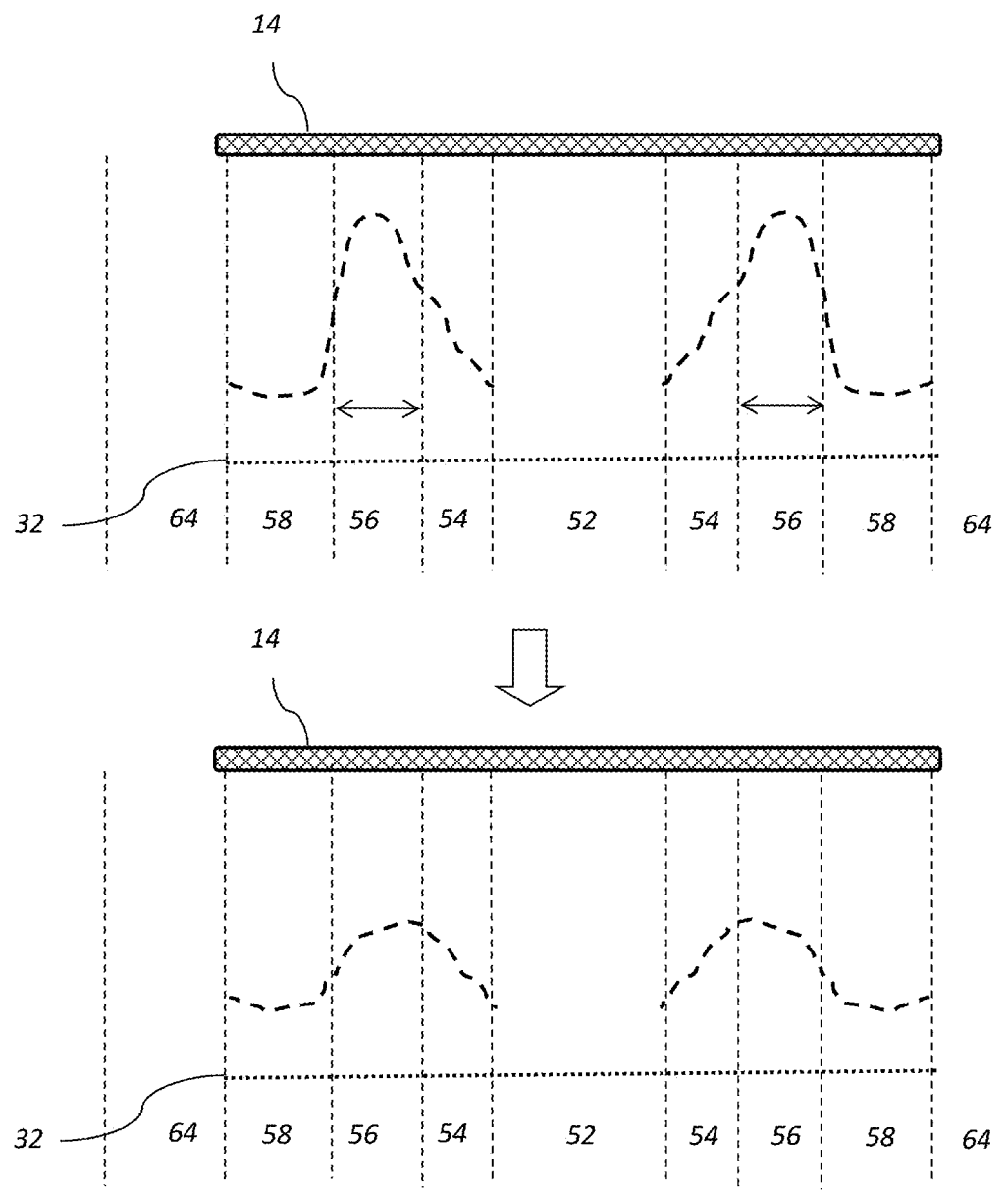
FIG. 21 shows the thickness profiles before (upper) and post (lower) another tuning method by a first step of a two-step tuning process for a "small pad" system.
Figure 22:
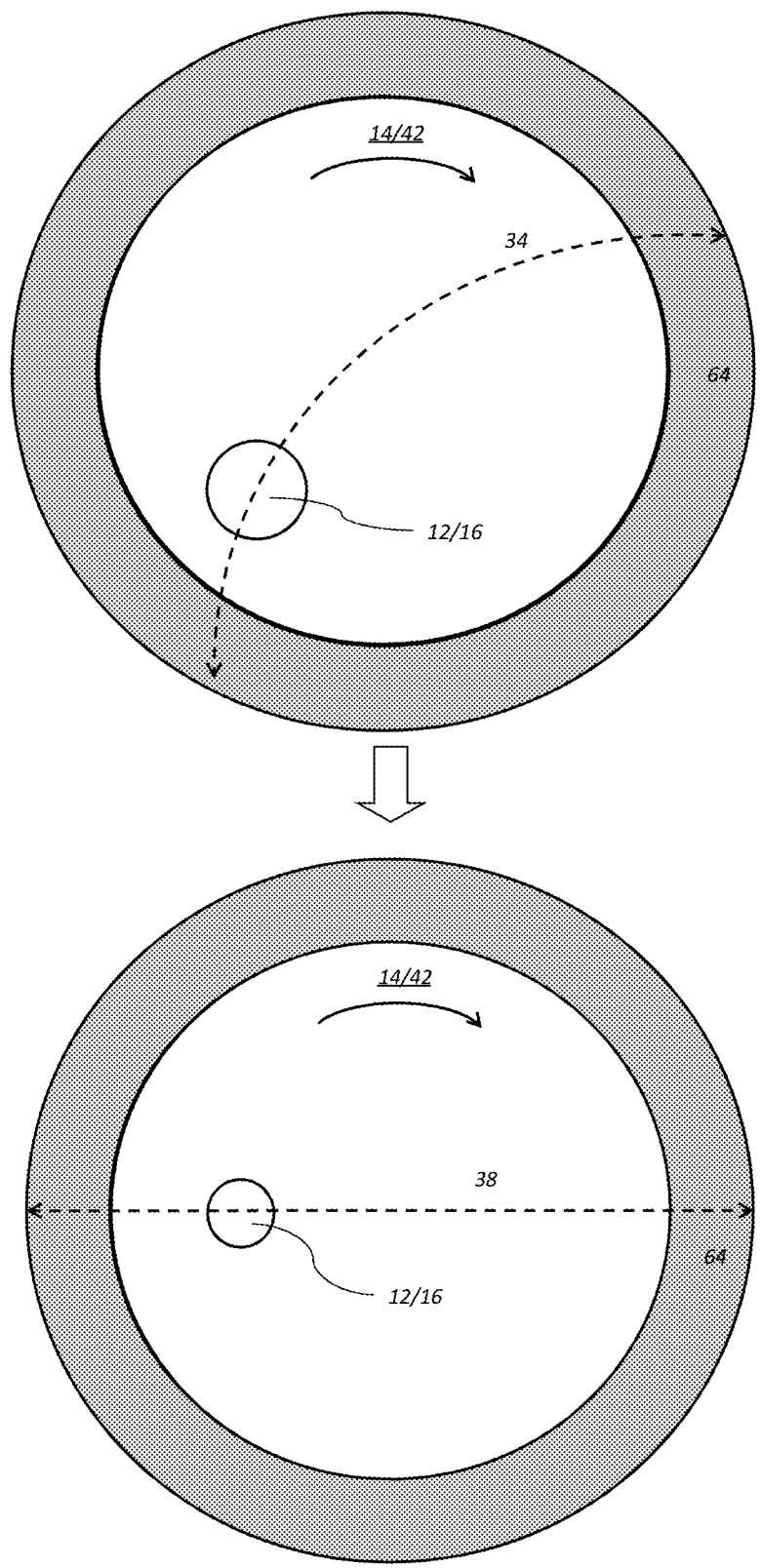
FIG. 22 shows an example of a two-step tuning process for a "small pad" system. The first step uses a bigger pad with curved scanning path, while the second step uses a smaller pad with diametrical scanning path.

For the rough tuning step, oscillation scanning can be used to flatten the protrusive portions in the thickness profile first. As shown in the upper graph of FIG. 21, prior to the rough tuning step, the protrusive portion is confined in a specific zone 56, after utilizing the oscillation scanning with a bigger head 16 (40 mm in diameter as an example. The size of the head may be bigger than the oscillation region in order to remove or reduce the size of a protrusive shape as described above in connection with FIGS. 14-16), the protrusive portion is flatten comparing to other zones 54/58 as shown in the lower graph of FIG. 21 illustrating the thickness profile after the rough tuning has been performed. In the next step (e.g., in a fine tuning step), a smaller head 16 (10 mm in diameter as an example) can be used with a strategy like "Constant Parameters Within-Zone" introduced above in connection with FIGS. 17 and 18 to fine tune the thickness profile towards the mean thickness target 32 with the best within-wafer-uniformity could be achieved. Different scanning paths can be used in these separating steps as shown in FIG. 22. Curved scanning 34 and a bigger head 16 is used for the rough tuning step, next diametrical scanning 38 and a smaller head 16 is used for the fine tuning step. From the system design viewpoints, it is feasible to place the heads of different sizes in one single chamber or in separate chambers with wafer transfer in between.

Part III. Procedure of Thickness Profile Tuning

A procedure of thickness profile tuning as an example is herein described:

1. Acquire Incoming Thickness Profile from Previous Process.

In certain embodiments, the incoming thickness can be measured at as many points as possible to ensure the resolution of the tuning afterwards. These previous processes aforementioned could be a multiple-zone-head used CMP process, a film deposition process, or any process where it is desirable to have an improved within-wafer-uniformity.

2. Determine the Conditions for the Tuning.

i. The number of the steps for the tuning, the purpose of each step, and the size of head. For an example, only one step of bigger head (40 mm in diameter) may be needed for tuning to meet an example criteria to improve the within-wafer-uniformity from 200 angstroms to 100 angstroms, which may not be particularly challenging. Or a two steps tuning may be required in certain embodiments, which may include the use the heads of different sizes (e.g., 40 mm and 10 mm heads used in sequence) to meet a relatively high challenge within-wafer-uniformity criteria of 10 angstroms.

ii. Tuning strategy, scanning method & path. For the two steps tuning mentioned above, the first step is to use oscillation scanning to flatten the protrusive portions in the profiles, and the second step is to use oscillation scanning for the center area of the wafer, and use "Constant Parameters Within-Zone" strategy with diametrical scanning for other areas of the wafer.

iii. Zone division: the number of the zones, the starting and ending position of each zone. Still for the same example, in the first step, the protrusive portions may be defined between radial 30~70 mm and radial 100~130 mm. In the second step, the center area of the wafer can be selected to be radial -20~20 mm, and other areas can be divided into ten zones of equal size.

iv. Polishing parameters, including down-force, scanning speed, wafer rotation speed, head self-rotation speed, and/or slurry flow-rate for each zone. By looking up the well-characterized database of removal curves (FIG. 11 and FIG. 13 as examples), and the target of the overall mean thickness, these parameters can be selected accordingly.

Though it may seems complicated to properly select all the conditions described above, since the incoming thickness profiles are usually predicable and fall within few types (unless the previous processes suffer excursions somehow), the models may have been previously specifically characterized. So when the wafers arrive, a corresponding preset recipe can be selected and run with repeatable results.

3. Load the Wafer in to the System, and Start the Process.

A cleaning step is needed to remove the slurry particles remaining on the surface of the wafer, and the wafer will be spun dried as well.

4. Unload the Wafer and Measure the Thickness Profile on the Wafer.

A measuring device can be integrated in to the system as a practice widely used now. Though it is reiterated that the parameters should have been well characterized, when the results still are short of the expectation even after multiple-step tunings, a rework process can be added as a remedy. But it may make more sense to reexamine and refine the characterizations to avoid such reworks in a long run.

As herein described, a "small pad" system is proposed to realize localized polishing of tens of angstroms at the most post other manufacturing processes, in order to meet the stringent within-wafer-uniformity criteria for advanced semiconductor microchip manufacturing. The profiles to be tuned is divided into segments or zones, and the tuning itself can be carried out with the choices of multiple steps, different scanning methods for different areas of the wafer, and the selected size of heads while trying to reach the balance between the throughput and the resolution of the tuning with the foundation of well-characterized comprehensive models.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

As used herein, the term "plurality" denotes two or more. For example, a plurality of components indicates two or more components. The phrase "based on" does not mean "based only on," unless expressly specified otherwise. In other words, the phrase "based on" describes both "based only on" and "based at least on."

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

The functions described herein may be stored as one or more instructions on a computer-readable medium. The term "computer-readable medium" refers to any available medium that can be accessed by a computer, processor, or controller. By way of example, and not limitation, such a medium may comprise random access memory (RAM), read-only memory (ROM), electrically erasable programmable read-only memory (EEPROM), flash memory, compact disc read-only memory (CD-ROM) or other optical disk storage, magnetic disk storage or other magnetic storage devices, or any other medium that can be used to store desired program code in the form of instructions or data structures and that can be accessed by a computer. It should be noted that a computer-readable medium may be tangible and non-transitory. As used herein, the term "code" may refer to software, instructions, code or data that is/are executable by a computing device or processor.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

The previous description of the disclosed implementations is provided to enable any person skilled in the art to make or use the present invention. Various modifications to these implementations will be readily apparent to those skilled in the art, and the generic principles defined herein may be applied to other implementations without departing from the scope of the invention. For example, it will be appreciated that one of ordinary skill in the art will be able to employ a number corresponding alternative and equivalent structural details, such as equivalent ways of fastening, mounting, coupling, or engaging tool components, equivalent mechanisms for producing particular actuation motions, and equivalent mechanisms for delivering electrical energy. Thus, the present invention is not intended to be limited to the implementations shown herein but is to be accorded the widest scope consistent with the principles and novel features disclosed herein.

What is claimed is:

1. A system for thickness profile tuning of a wafer, comprising:
    a rotating vacuum stage configured to hold a wafer, the wafer comprising an upwardly facing surface film with an incoming film thickness profile;
    an edge ring surrounding the vacuum stage and forming an alcove for the wafer;
    a rotating head;
    a pad attached to the rotating head, the pad comprising a downwardly facing front side surface, the rotating head configured to sweep the pad along a path, a surface area of the head being less than a surface area of the wafer;
    a controller; and
    a computer-readable memory in communication with the controller and having stored thereon computer executable instructions to cause the controller to be configured to:
        remove at least a portion of the surface film of the wafer via a plurality of steps, each of the steps comprising:
            bringing the surface film of the wafer and the front side down surface of the pad into contact with each other, and
            sweeping the head along the path comprising moving the pad across a boundary between the wafer and the edge ring, wherein the edge ring is positioned around the wafer during the sweeping such that a top surface of the edge ring is approximately aligned with the surface film of the wafer to avoid any shock when the pad moves across the boundary and to prevent removal drops at the edge of the wafer, and
        adjust one or more parameters for each of the removal steps to affect an amount of film thickness removed, wherein the one or more parameters are adjusted based on the incoming thickness profile and a criteria for the within-wafer-uniformity,
    wherein at least one of the removal steps comprises a rough tuning step including:
        determining a specific zone of the incoming film thickness profile in which at least one protrusive portion is confined, and
        oscillation scanning the head along the specific zone of the path to flatten the at least one protrusive portion in the incoming film thickness profile, the oscillation scanning including moving the head back and forth within the specific zone.

2. The system of claim 1, wherein the computer-readable memory further has stored thereon computer executable instructions to cause the controller to:
    determine the number of the steps based on the incoming thickness profile and the criteria for the within-wafer-uniformity.

3. The system of claim 2, wherein the one or more parameters comprise one or more of: a size of the head, a head scanning method, a head scanning path, a number of the zones into which the path is divided, starting and ending positions of the zones, a within-zone tuning strategy, polishing parameters, a scanning speed, a wafer rotation speed, a head self-rotation speed, and a slurry flow-rate, and wherein at least one of the parameters is different for two of the steps.

4. The system of claim 3, wherein a smaller head is used for one of the steps with a higher resolution than for another step with a lower resolution.

5. The system of claim 4, wherein a larger head is used for one of the steps with a shorter cycle time than for another step with a higher cycle time.

6. The system of claim 3, wherein the head scanning methods include one or more of: a one-way scanning method in which the head moves in one direction until a final position is reached and the oscillation scanning.

7. The system of claim 3, wherein the head scanning paths include one or more of: curved, radial, and diametrical paths.

8. The system of claim 3, wherein the computer-readable memory further has stored thereon computer executable instructions to cause the controller to:

determine the number of the zones based on a topography of the incoming thickness profile and a criteria of the tuning resolution.

9. The system of claim 3, wherein the computer-readable memory further has stored thereon computer executable instructions to cause the controller to:

determine the starting and ending positions of the zones to be of equal size, or determine the starting and ending positions of the zones based on feature points of a topography of the thickness profiles.

10. The system of claim 3, wherein the within-zone tuning strategies are used to tune an average thickness of each zone to a target thickness.

11. The system of claim 3, wherein the computer-readable memory further has stored thereon computer executable instructions to cause the controller to:

determine the polishing parameters based on models including removal curves which characterize the correlation between the amount of film thickness removed at any location on the wafer to the polishing parameters, wherein the polishing parameters include one or more of: the size of the head, a down-force, the scanning speed, the wafer rotation speed, the head self-rotation speed, and the slurry flow-rate.

12. The system of claim 1, wherein at least one of the removal steps comprises:

oscillation scanning the head along the path, including using a low wafer rotation speed, which is less than 30 RPM, to tune a center of the wafer, within a radially measured distance of 30 mm from the center of the wafer.

* * * * *